(12) United States Patent
Lee et al.

(10) Patent No.: US 12,433,129 B2
(45) Date of Patent: Sep. 30, 2025

(54) DISPLAY APPARATUS HAVING A BANK LAYER INCLUDING A FIRST BANK PORTION AND A SECOND BANK PORTION

(71) Applicant: Samsung Display Co., Ltd., Yongin-Si (KR)

(72) Inventors: Kyeuk Lee, Yongin-si (KR); Sunkwang Kim, Yongin-si (KR); Geunho Lee, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 553 days.

(21) Appl. No.: 17/853,985

(22) Filed: Jun. 30, 2022

(65) Prior Publication Data
US 2023/0005996 A1  Jan. 5, 2023

(30) Foreign Application Priority Data
Jul. 1, 2021 (KR) .................. 10-2021-0086715

(51) Int. Cl.
*H10K 59/38* (2023.01)
*H10K 50/84* (2023.01)
*H10K 59/122* (2023.01)
*H10K 59/80* (2023.01)

(52) U.S. Cl.
CPC ............. *H10K 59/38* (2023.02); *H10K 50/84* (2023.02); *H10K 59/122* (2023.02); *H10K 59/873* (2023.02)

(58) Field of Classification Search
CPC ....... H10K 59/38; H10K 59/122; H10K 50/84
USPC ........................................................ 257/280
See application file for complete search history.

(56) References Cited

U.S. PATENT DOCUMENTS

| | | | |
|---|---|---|---|
| 10,678,091 B2 | 6/2020 | Lee et al. | |
| 11,322,552 B2 | 5/2022 | Kim et al. | |
| 11,322,553 B2 | 5/2022 | Song et al. | |
| 2012/0098414 A1 | 4/2012 | Nakamura | |
| 2021/0143222 A1* | 5/2021 | Song | H10K 59/123 |

FOREIGN PATENT DOCUMENTS

| | | |
|---|---|---|
| CN | 111736388 A | 10/2020 |
| JP | 2006-072176 A | 3/2006 |
| JP | 2015-128027 A | 7/2015 |
| KR | 10-2012-0111912 A | 10/2012 |
| KR | 10-2019-0047592 A | 5/2019 |

(Continued)

OTHER PUBLICATIONS

European Search Report corresponding to European Patent Application No. 22181715.8 dated Nov. 29, 2022, 8 pages.

*Primary Examiner* — Xia L Cross
(74) *Attorney, Agent, or Firm* — Innovation Counsel LLP

(57) ABSTRACT

A display apparatus includes: a display substrate including a first substrate and a light-emitting element disposed on the first substrate; and a color filter substrate arranged to face the display substrate, wherein the color filter substrate includes: a second substrate; a color filter layer disposed on the second substrate and including a first color filter, a second color filter, and a third color filter; a bank layer disposed on the color filter layer and including a first bank portion that defines a first opening corresponding to the light-emitting element and a second bank portion that defines a second opening around the first opening.

24 Claims, 15 Drawing Sheets

(56) References Cited

FOREIGN PATENT DOCUMENTS

| KR | 1020200080729 A | 7/2020 |
|----|-----------------|--------|
| KR | 1020210057273 A | 5/2021 |
| WO | 2010-146653 A1 | 12/2010 |

* cited by examiner

DISPLAY APPARATUS HAVING A BANK LAYER INCLUDING A FIRST BANK PORTION AND A SECOND BANK PORTION

CROSS-REFERENCE TO RELATED APPLICATION

This application is based on and claims priority under 35 U.S.C. § 119 to Korean Patent Application No. 10-2021-0086715, filed on Jul. 1, 2021, in the Korean Intellectual Property Office, the disclosure of which is incorporated by reference herein in its entirety.

BACKGROUND

1. Field

One or more embodiments relate to display apparatuses, and more particularly, to display apparatuses having improved display quality.

2. Description of the Related Art

Display apparatuses may include a color conversion device for generating a color by receiving light from a light source, for example, an organic light-emitting element and the like. The color conversion device may be arranged in a display apparatus in the form of a separate substrate, or may be provided to be directly integrated in components in the display apparatus.

As an example, the color conversion device may receive blue light from a light source and emit blue, green, and red light, so that images with various colors may be viewed. In this case, the green and red light may be generated by converting the received blue light, and the blue light may be generated by emitting the received blue light as it is or by scattering the received blue light to improve a viewing angle.

SUMMARY

One or more embodiments provide display apparatuses including a color conversion device, and particularly display apparatuses having improved display quality. However, such an objective is an exemplary example, and the scope of the present disclosure is not limited thereby.

Additional aspects will be set forth in part in the description which follows and, in part, will be apparent from the description, or may be learned by practice of the presented embodiments of the disclosure.

According to an aspect of the disclosure, a display apparatus includes a display substrate including a first substrate and a light-emitting element disposed on the first substrate, and a color filter substrate disposed to face the display substrate, wherein the color filter substrate includes: a second substrate, a color filter layer disposed on the second substrate and including a first color filter, a second color filter, and a third color filter, a bank layer disposed on the color filter layer and including a first bank portion that defines a first opening corresponding to the light-emitting element and a second bank portion that defines a second opening around the first opening, wherein a second height from an upper surface of the second substrate to an upper surface of at least part of the second bank portion is less than a first height from the upper surface of the second substrate to an upper surface of the first bank portion, and a color conversion layer disposed in the first opening.

In an embodiment, the first color filter, the second color filter, and the third color filter may be disposed between the second substrate and the first bank portion.

In an embodiment, at least part of the second bank portion may be disposed directly on the second substrate.

In an embodiment, at least one of the first color filter, the second color filter, and the third color filter may not be disposed between the second substrate and the second bank portion.

In an embodiment, the third color filter may be disposed between the second substrate and the second bank portion.

In an embodiment, an area of the second opening may be less than an area of the first opening.

In an embodiment, at least one of the first color filter, the second color filter, and the third color filter may be exposed through the first opening.

In an embodiment, the color conversion layer may include a first color conversion layer, a second color conversion layer, and a transmissive layer, wherein the first color conversion layer is disposed on the first color filter, the second color conversion layer is disposed on the second color filter, and the transmissive layer is disposed on the third color filter.

In an embodiment, the first color conversion layer may include a first quantum dot and the second color conversion layer may include a second quantum dot.

In an embodiment, the second opening may include a plurality of second openings, the second bank portion may include a branch portion in which second bank portions extending in different directions cross each other, and a height from the upper surface of the second substrate to an upper surface of the branch portion may be less than a height from the upper surface of the second substrate to the upper surface of the first bank portion.

In an embodiment, a height from the second substrate to the upper surface of the branch portion may be less than a height from the second substrate to an upper surface of the second bank portion except the branch portion.

In an embodiment, a step between the upper surface of the branch portion and the upper surface of the first bank portion may be about 3.5 μm or more.

In an embodiment, at least one of the first color filter, the second color filter, and the third color filter may be disposed in the second opening.

In an embodiment, the color filter layer may have a portion having a reduced thickness and disposed between the second substrate and the bank layer.

In an embodiment, at least one of the first color filter, the second color filter, and the third color filter may have a step between the second substrate and the second bank portion.

In an embodiment, a thickness of at least one of the first color filter, the second color filter and the third color filter disposed in a region corresponding to the second bank portion, may be less than a thickness of at least one of the first color filter, the second color filter, and the third color filter disposed in a region corresponding to the first bank portion.

In an embodiment, the second opening may include a plurality of second openings, the second bank portion may include a branch portion in which second bank portions extending in different directions cross each other, and a thickness of at least one of the first color filter, the second color filter, and the third color filter in a region corresponding to the branch portion may be less than the thickness of the at least one of the first color filter, the second color filter, and the third color filter in a remaining second bank portion except the branch portion.

In an embodiment, the light-emitting element may include an organic light-emitting diode that emits blue light.

In an embodiment, the display substrate may further include a thin film encapsulation layer that may be disposed to cover the light-emitting element, and a distance from an upper surface of the thin film encapsulation layer to an upper surface of the second bank portion may be greater than a distance from the upper surface of the thin film encapsulation layer to the upper surface of the first bank portion.

In an embodiment, the second opening may include a plurality of second openings, the second bank portion may include a branch portion in which second bank portions extending in different directions cross each other, and a distance from the upper surface of the thin film encapsulation layer to an upper surface of the branch portion may be greater than the distance from the upper surface of the thin film encapsulation layer to the upper surface of the first bank portion.

In an embodiment, the second opening may include a plurality of second openings, the second bank portion may include a branch portion in which second bank portions extending in different directions cross each other, and the distance from the upper surface of the thin film encapsulation layer to the upper surface of the branch portion may be greater than a distance from the upper surface of the thin film encapsulation layer to the surface of the second bank portion except the branch portion.

According to another aspect of the disclosure, a display apparatus includes a first substrate and a second substrate disposed to face the first substrate, a light-emitting element disposed on the first substrate, a thin film encapsulation layer disposed to cover the light-emitting element, a bank layer disposed above the thin film encapsulation layer and having a first opening corresponding to the light-emitting element and a second opening disposed around the first opening, a color conversion layer disposed in the first opening, and a color filter layer disposed between the second substrate, and the color conversion layer, and between the second substrate and the bank layer, wherein the bank layer include a first bank portion that defines the first opening and a second bank portion that defines the second opening, and a second distance from an upper surface of the thin film encapsulation layer to an upper surface of the second bank portion may be greater than a first distance from the upper surface of the thin film encapsulation layer to an upper surface of the first bank portion.

In an embodiment, the color filter layer may include a first portion disposed between the second substrate and the first bank portion and a second portion disposed between the second substrate and the second bank portion, and a thickness of the second portion may be less than a thickness of the first portion.

In an embodiment, at least part of the color conversion layer may include a quantum dot.

Other aspects, features, and advantages than those described above will become apparent from the following drawings, claims, and detailed description of the disclosure.

These general and specific aspects may be embodied using a system, a method, a computer program, or any combination of a system, a method, and a computer program.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
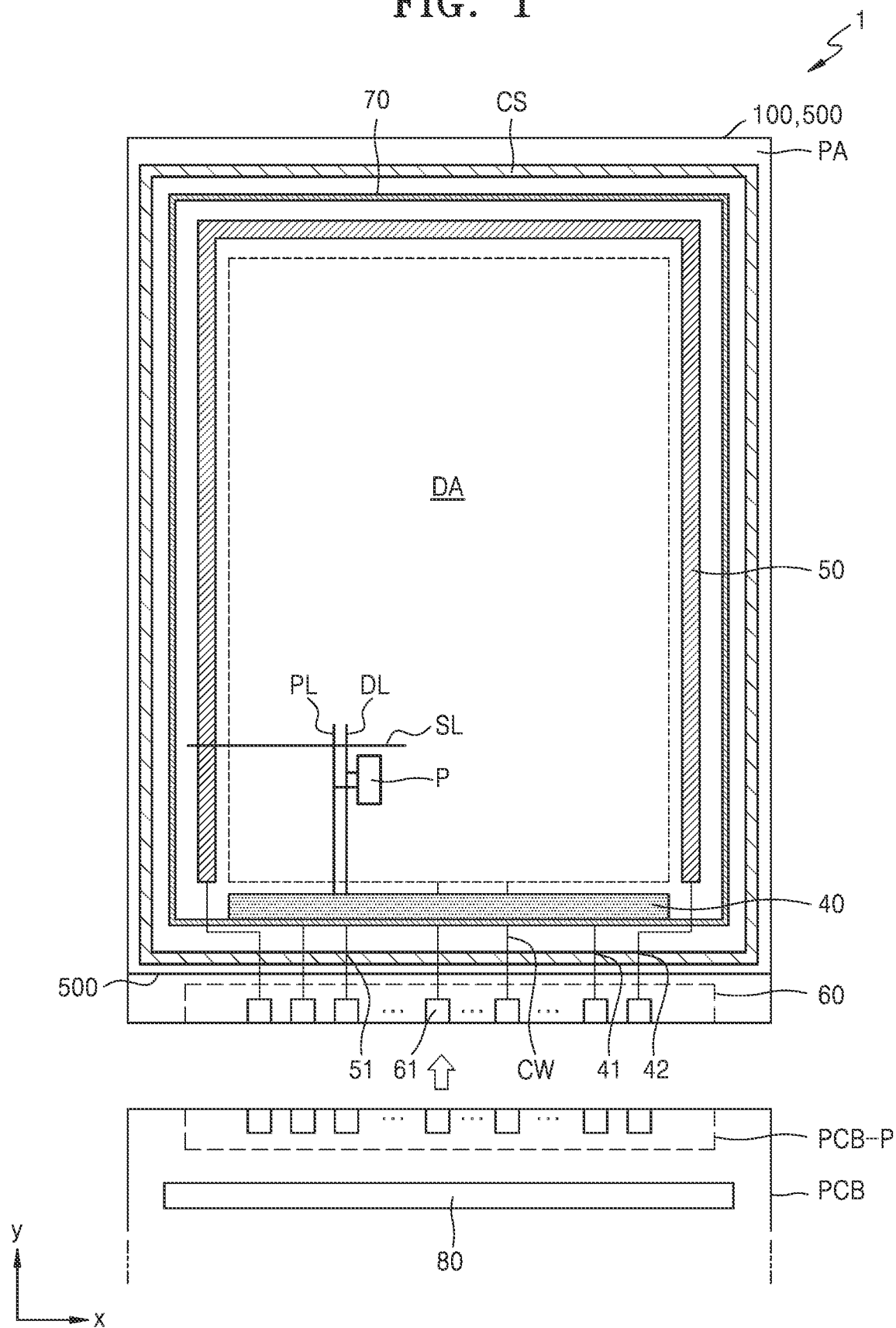
FIGS. 1 and 2 are schematic plan views of examples of a display apparatus according to one or more embodiments.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Various modifications may be applied to the present embodiments, and particular embodiments will be illustrated in the drawings and described in the detailed description section. The effect and features of the present embodiments, and a method to achieve the same, will be clearer referring to the detailed descriptions below with the drawings. However, the present embodiments may be implemented in various forms, not by being limited to the embodiments presented below.

Hereinafter, exemplary embodiments will be described in detail with reference to the accompanying drawings, and in the description with reference to the drawings, the same or corresponding constituents are indicated by the same reference numerals and redundant descriptions thereof are omitted.

It will be understood that although the terms "first," "second," etc. may be used herein to describe various components, these components should not be limited by these terms. These components are only used to distinguish one component from another.

As used herein, the singular forms are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on" another layer, region, or component, it can be directly or indirectly formed on the other layer, region, or component. That is, for example, intervening layers, regions, or components may be present.

It will be understood that when a layer, region, or component is referred to as being "connected to" another layer, region, or component, it can be directly connected to the other layer, region, or component or indirectly connected to the other layer, region, or component via intervening layers, regions, or components. For example, in the specification, when a layer, region, or component is referred to as being electrically connected to another layer, region, or component, it can be directly electrically connected to the other layer, region, or component or indirectly electrically connected to the other layer, region, or component via intervening layers, regions, or components.

In the specification, the expression such as "A and/or B" may include A, B, or A and B. Furthermore, the expression such as "at least one of A and B" may include A, B, or A and B.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When a certain embodiment may be implemented differently, a specific process order may be performed differently from the described order. For example, two consecutively described processes may be performed substantially at the same time or performed in an order opposite to the described order.

Sizes of components in the drawings may be exaggerated for convenience of explanation. For example, since sizes and thicknesses of components in the drawings are arbitrarily illustrated for convenience of explanation, the following embodiments are not limited thereto.

In the following description, an organic light-emitting display apparatus is descried an example of a display apparatus 1 according to one or more embodiments, but the disclosure is not limited thereto. In another embodiment, the display apparatus 1 may include a display apparatus such as an inorganic light-emitting display apparatus, an inorganic electro luminescence (EL) display apparatus, or a quantum dot light-emitting display apparatus. For example, an emission layer of a display element provided in the display apparatus 1 may include an organic material, an inorganic material, quantum dots, both of an organic material and quantum dots, or both of an inorganic material and quantum dots.

Figure 2:
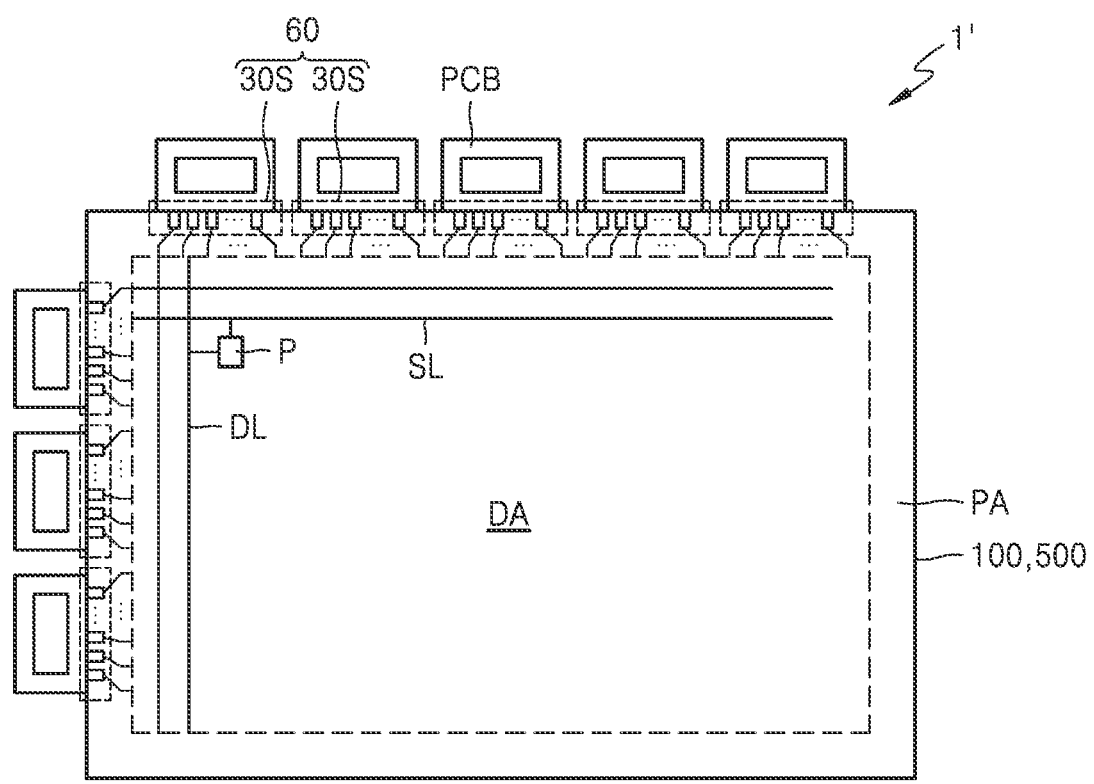

FIGS. 1 and 2 are schematic plan views of the display apparatus 1 according to one or more embodiments.

Referring to FIG. 1, the display apparatus 1 may include a display area DA and a peripheral area PA arranged around the display area DA. The display apparatus 1 may provide a certain image by using light emitted from a plurality of pixels P arranged in the display area DA. In the specification, the pixel P may include one display element, for example, an organic light-emitting diode.

The display area DA may include the pixels P. Each of the pixels P is connected to a data line DL extending in an y direction and a scan line SL extending in a x direction crossing the y direction. Each of the pixels P is connected to a driving voltage line PL extending in they direction.

Each of the pixels P may include a light-emitting device such as an organic light-emitting diode OLED. Each of the pixels P may emit light, for example, red, green, blue, or white light, through the organic light-emitting diode OLED.

In an embodiment, in the pixels P, aside from the color emitted from the organic light-emitting diode OLED included in each of the pixels P, the color of each of the pixels P may be implemented by a color filter substrate 20 (see FIG. 4 and the like) arranged above the organic light-emitting diode OLED. The color filter substrate 20 may include a second substrate 500. The color filter substrate 20 is described in detail with reference to FIGS. 6 to 14 and the like.

Each of the pixels P may be electrically connected to internal circuits arranged in the peripheral area PA. A first power supply wiring 40, a second power supply wiring 50, and a pad portion 60 may be arranged in the peripheral area PA.

The first power supply wiring 40 may be arranged to correspond to one side of the display area DA. The first power supply wiring 40 may be connected to a plurality of driving voltage lines PL that are configured to deliver a driving voltage ELVDD (see FIGS. 3A and 3B) to the pixel P.

The second power supply wiring 50 in a loop shape with one open side may partially surround the display area DA. The second power supply wiring 50 may provide a common voltage ELVSS (see FIGS. 3A and 3B) to a counter electrode of the pixel P. The second power supply wiring 50 may be referred to as the common voltage supply wiring.

The pad portion 60 may include a plurality of pads 61 and may be arranged at one side of a first substrate 100. Each of the pads 61 may be connected to a first connection wiring 41 connected to the first power supply wiring 40 or to connection wirings CW extending toward the display area DA, and the like. The pads 61 of the pad portion 60 are not covered by an insulating layer and may be electrically connected to a printed circuit board PCB. A port portion PCB-P of the printed circuit board PCB may be electrically connected to the pad portion 60.

The printed circuit board PCB may transmit a signal from a controller (not shown) or power to the pad portion 60. The controller may provide the driving voltage ELVDD and the common voltage ELVSS of FIGS. 3A and 3B, respectively, to the first and second power supply wirings 40 and 50 through first and second connection wirings 41 and 42.

A data driving circuit 80 is electrically connected to the data line DL. A data signal of the data driving circuit 80 may be provided to each of the pixels P through a connection wiring CW connected to the pad portion 60 and the data line DL. Although FIG. 1 illustrates that the data driving circuit 80 is arranged on the printed circuit board PCB, in another embodiment, the data driving circuit 80 may be arranged on the first substrate 100. For example, the data driving circuit 80 may be connected to the pad portion 60.

A dam portion 70 may be arranged in the peripheral area PA. The dam portion 70 may block an organic material from flowing toward an edge of the first substrate 100 during the formation of an organic encapsulation layer 320 (see FIG. 5) of a thin film encapsulation layer 300 (see FIG. 14), thereby preventing the formation of an edge tail of the organic encapsulation layer 320. The dam portion 70 may be arranged in the peripheral area PA to surround at least part of the display area DA. The dam portion 70 may include a plurality of dams. When a plurality of dams are arranged, the respective dams may be arranged apart from each other. The dam portion 70 may be arranged close to the display area DA than to a sealant CS, in the peripheral area PA.

An internal driving circuit portion (not shown) for providing a scan signal of each pixel may be further provided in the peripheral area PA. In some embodiments, the internal driving circuit portion and the dam portion 70 may be arranged to overlap each other.

The display apparatus 1 may be formed as the first substrate 100 and the second substrate 500 which are combined with each other by the sealant CS. The sealant CS is formed to surround the display area DA along the peripheral area PA of the first substrate 100, thereby combining the first substrate 100 and the second substrate 500 with each other.

In another embodiment, the first substrate 100 and the second substrate 500 may be combined with each other using an adhesive layer which functions as a filler and disposed between the first substrate 100 and the second substrate 500.

Although FIG. 1 illustrates that one printed circuit board PCB is attached to the pad portion 60, as illustrated in FIG. 2 a plurality of printed circuit boards PCB may be attached to the pad portion 60.

In FIG. 2, the pad portion 60 may be arranged on the major axis (e.g., the long side axis) and the minor axis (e.g., the short side axis) of the first substrate 100. The pad portion 60 may include a plurality of sub-pad portions 30S, and one printed circuit board PCB may be attached to each of the sub-pad portions 30S. In an embodiment, a display apparatus 1' of FIG. 2 may be used for large display apparatuses such as tablets, monitors, TVs, and the like.

Figure 3A:
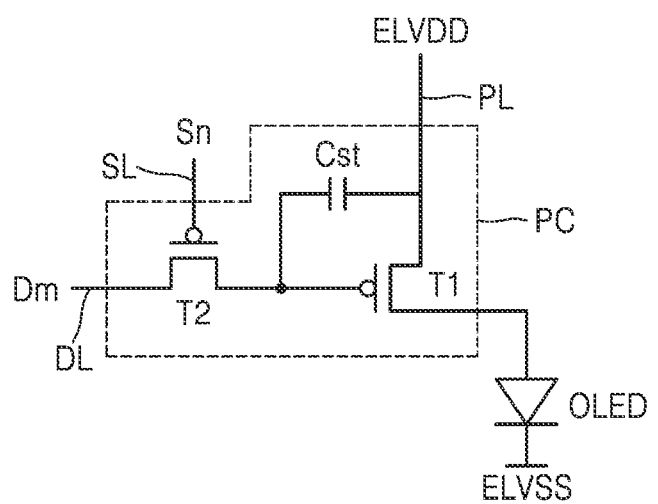
FIGS. 3A and 3B are equivalent circuit diagrams of a pixel included in a display apparatus according to one or more embodiments.
Figure 3B:
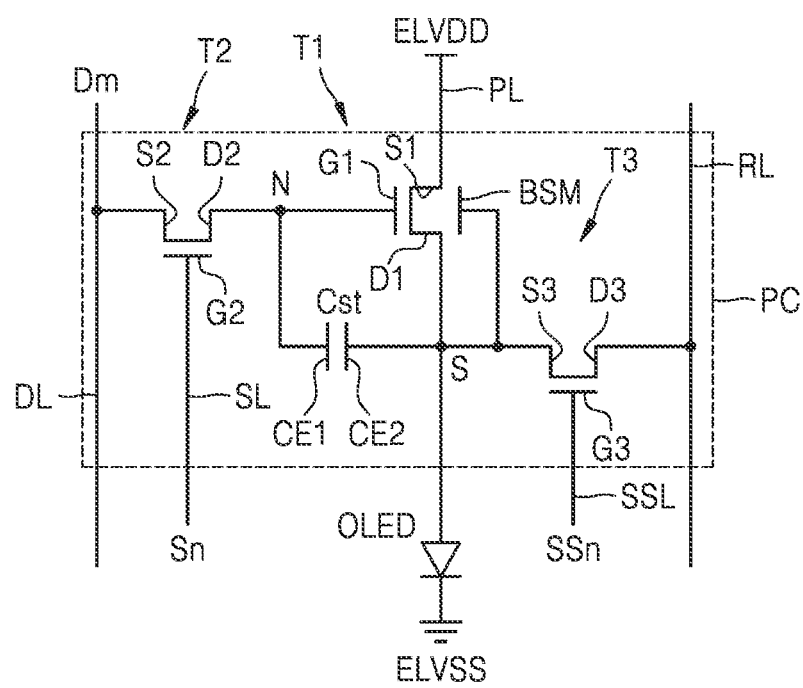

FIGS. 3A and 3B are equivalent circuit diagrams of a pixel included in a display apparatus according to one or more embodiments.

Referring to FIG. 3A, each of the pixels P may be implemented as a pixel circuit PC connected to the scan line SL and the data line DL and the organic light-emitting diode OLED connected to the pixel circuit PC. The pixel circuit PC may include a driving thin film transistor T1, a switching thin film transistor T2, and a storage capacitor Cst. The switching thin film transistor T2 may be connected to the scan line SL and the data line DL, and may be configured to transmit, to the driving thin film transistor T1, a data signal Dm that is input through the data line DL in response to a scan signal Sn input through the scan line SL.

The storage capacitor Cst may be connected between the switching thin film transistor T2 and the driving voltage line PL, and may be configured to store a voltage corresponding to a difference between the voltage received from the switching thin film transistor T2 and the driving voltage ELVDD supplied through the driving voltage line PL.

The driving thin film transistor T1 may be connected between the driving voltage line PL and the organic light-emitting diode OLED, and may be configured to control a driving current flowing in the organic light-emitting diode OLED from the driving voltage line PL corresponding to the voltage value stored in the storage capacitor Cst. The organic light-emitting diode OLED may emit light having a certain luminance by the driving current.

Although FIG. 3A illustrates a case in which the pixel circuit PC includes two thin film transistor and one storage thin film transistor, the disclosure is not limited thereto.

Referring to FIG. 3B, the pixel circuit PC may include a driving thin film transistor T1, a switching thin film transistor T2, a sensing thin film transistor T3, and a storage capacitor Cst.

The scan line SL may be connected to a gate electrode G2 of the switching thin film transistor T2, the data line DL may be connected to a source electrode S2, and a first electrode CE1 of the storage capacitor Cst may be connected to a drain electrode D2.

Accordingly, the switching thin film transistor T2 may be configured to supply a data voltage DM of the data line DL to a first node N in response to the scan signal Sn from the scan line SL of each of the pixels P.

In the driving thin film transistor T1, a gate electrode G1 may be connected to the first node N, a source electrode S1 may be connected to the driving voltage line PL that is configured to supply the driving voltage ELVDD, and a drain electrode D1 may be connected to an anode electrode of the organic light-emitting diode OLED.

Accordingly, the driving thin film transistor T1 may be configured to control an amount of a current flowing in the organic light-emitting diode OLED according to a source-gate voltage Vgs thereof, that is, a voltage applied between the driving voltage ELVDD and the first node N.

In the sensing thin film transistor T3, a gate electrode G3 may be connected to a sensing control line SSL, a source electrode S3 may be connected to a second node S, and a drain electrode D3 may be connected to a reference voltage line RL. In an embodiment, the sensing thin film transistor T3 may be controlled by the scan line SL instead of the sensing control line SSL.

The sensing thin film transistor T3 may be configured to sense an electric potential of a pixel electrode, for example, an anode electrode, of the organic light-emitting diode OLED. The sensing thin film transistor T3 may be configured to supply a pre-charging voltage Vpre from the reference voltage line RL to the second node S in response to a sensing signal SSn from the sensing control line SSL, or to supply a voltage of the pixel electrode, for example, the anode electrode, of the organic light-emitting diode OLED to the reference voltage line RL during a sensing period.

In the storage capacitor Cst, the first electrode CE1 may be connected to the first node N, and a second electrode CE2 may be connected to the second node S. The storage capacitor Cst may be configured to be charged to a voltage difference between voltages respectively supplied to the first and second nodes N and S to supply the charged voltage as the driving voltage of the driving thin film transistor T1. For example, the storage capacitor Cst may be charged to a difference voltage between the data voltage Dm and a pre-charging voltage Vpre respectively supplied to the first and second nodes N and S.

A bias electrode BSM may be formed to correspond to the driving thin film transistor T1 to be connected to a source electrode S3 of the sensing thin film transistor T3. The bias electrode BSM may receive a voltage in association with the electric potential of the source electrode S3 of the sensing thin film transistor T3, so that the driving thin film transistor T1 may be stabilized. In an embodiment, the bias electrode BSM may not be connected to the source electrode S3 of the sensing thin film transistor T3 and may be connected to a separate bias wiring.

A counter electrode, for example, a cathode electrode, of the organic light-emitting diode OLED may receive the common voltage ELVSS. The organic light-emitting diode OLED may receive the driving current from the driving thin film transistor T1 to emit light.

Although FIG. 3B illustrate a case in which the signal lines SL, SSL, and DL, the reference voltage line RL, and the driving voltage line PL are provided for each of the pixels P, the disclosure is not limited thereto. For example, at least one of the signal lines SL, SSL, and DL, or/and the reference voltage line RL, and the driving voltage line PL may be shared by neighboring pixels.

The pixel circuit PC is not limited to the circuit design and the number of thin film transistors and storage capacitors described with reference to FIGS. 3A and 3B, the number and the circuit design may be changed in various ways.

Figure 4:
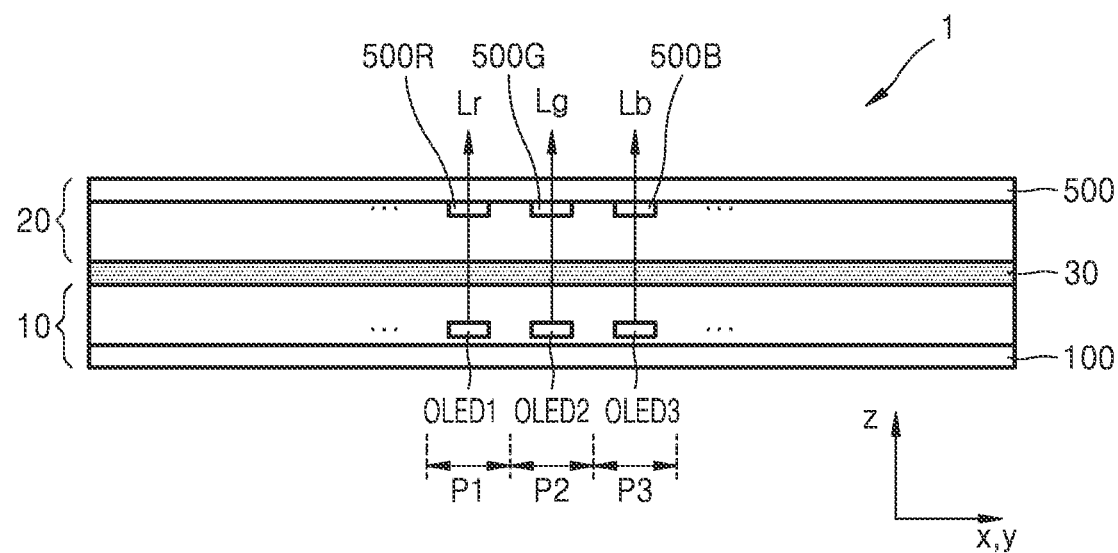
FIG. 4 is a cross-sectional view of a display apparatus according to one or more embodiments.

FIG. 4 is a schematic cross-sectional view of the display apparatus 1 according to one or more embodiments.

Referring to FIG. 4, the display apparatus 1 may include a display substrate 10 and a color filter substrate 20 arranged to face the display substrate 10. The display substrate 10 may include a first pixel P1, a second pixel P2, and a third pixel P3 which are arranged on the first substrate 100. The first pixel P1, the second pixel P2, and the third pixel P3 may be pixels that respectively emit light of different colors and disposed on the first substrate 100. For example, the first pixel P1 may emit red light Lr, the second pixel P2 may emit green light Lg, and the third pixel P3 may emit blue light Lb.

The first pixel P1, the second pixel P2, and the third pixel P3 may respectively include a first display element OLED1, a second display element OLED2, and a third display element OLED3, each including the organic light-emitting diode OLED. In the present embodiment, the first display element OLED1, the second display element OLED2, and the third display element OLED3 may be display elements that emit blue light.

The color filter substrate 20 may include filter portions 500R, 500G, and 500B. The light emitted from the first display element OLED1, the second display element OLED2, and the third display element OLED3 may pass through the filter portions 500R, 500G, and 500B, respectively, to be the red light Lr, the green light Lg, the blue light Lb.

The filter portions 500R, 500G, and 500B may be located directly on the second substrate 500. In this state, being located directly on the second substrate 500 may mean that the color filter substrate 20 is manufactured by forming the filter portions 500R, 500G, and 500B directly on the second substrate 500. Then, the filter portions 500R, 500G, and 500B are respectively arranged to face the first pixel P1, the second pixel P2, and the third pixel P3 so that the display substrate 10 and the color filter substrate 20 may be bonded to each other. FIG. 4 illustrates that the display substrate 10 and the color filter substrate 20 are bonded to each other via an adhesive layer 30. Although the adhesive layer 30 is, for example, an optical clear adhesive (OCA), the disclosure is not limited thereto. As an optional embodiment, the adhesive layer 30 may be omitted.

Figure 5:
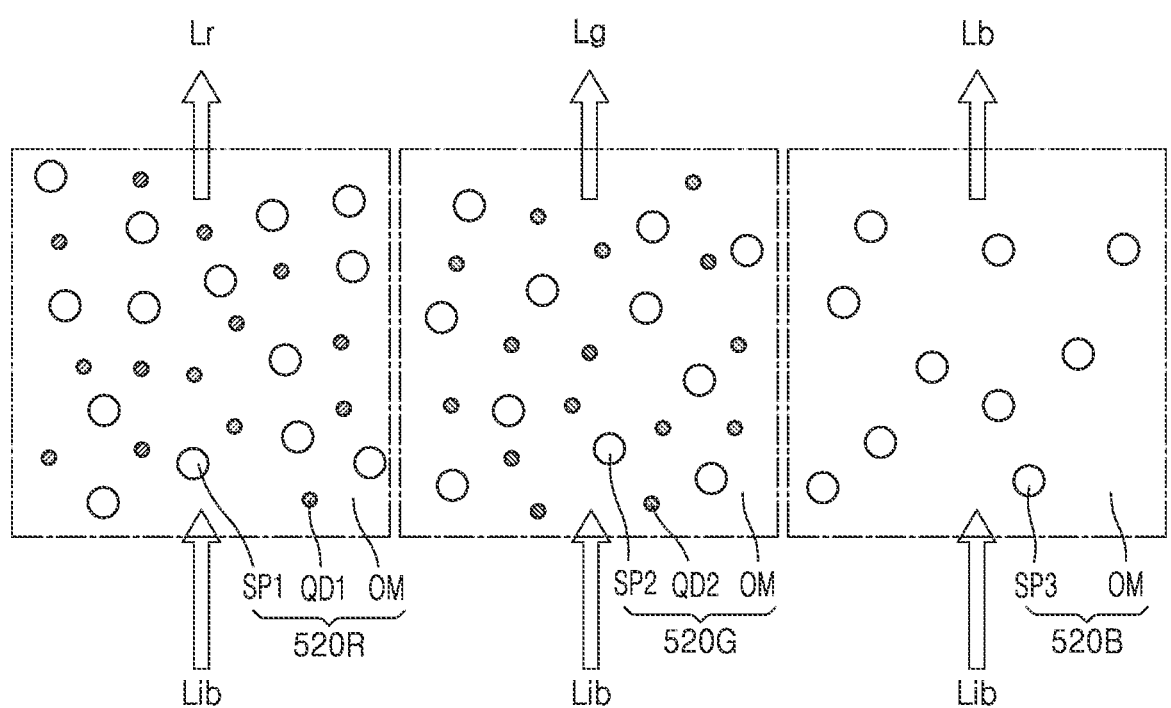
FIG. 5 is an enlarged view of a portion of a plurality of filter portions according to one or more embodiments.

FIG. 5 is an enlarged view of a portion of a plurality of filter portions according to one or more embodiments.

Figure 7:
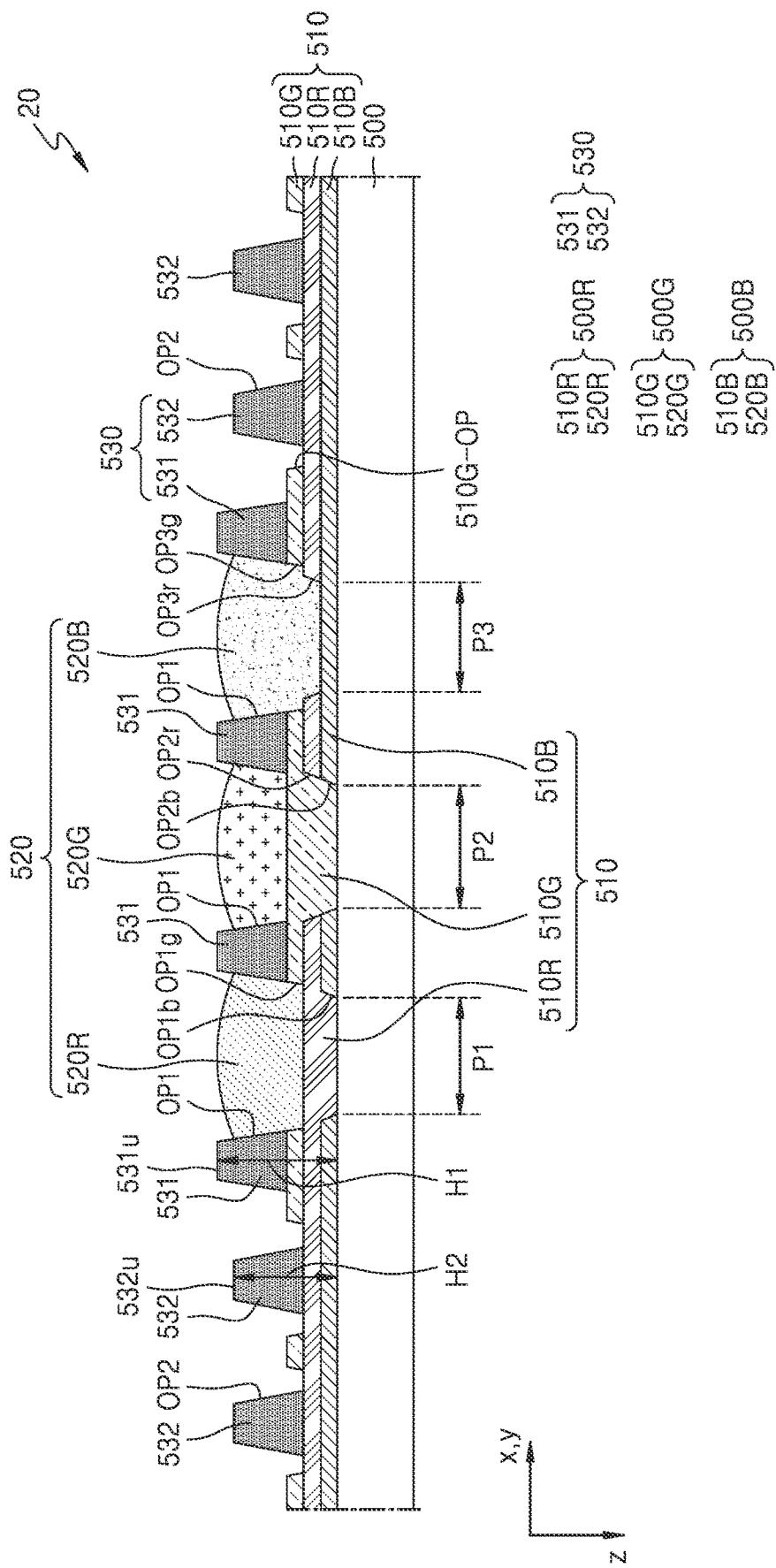
FIGS. 7 and 8 are schematic cross-sectional views of a color filter substrate according to one or more embodiments.

A first filter portion 500R may include a first color conversion layer 520R and a first color filter 510R (see FIG. 7), a second filter portion 500G may include a second color conversion layer 520G and a second color filter 510G (see FIG. 7), and a third filter portion 500B may include a transmissive layer 520B and a third color filter 510B (see FIG. 7). In FIG. 5, the first color conversion layer 520R, the second color conversion layer 520G, and the transmissive layer 530B of the first to third filter portions 500R, 500G, and 500B are illustrated in detail.

The first color conversion layer 520R and the second color conversion layer 520G may respectively include quantum dots and scattering particles. In an embodiment, the first color conversion layer 520R may include first quantum dots QD1, and the second color conversion layer 520G may include second quantum dots QD2. Furthermore, the first color conversion layer 520R, the second color conversion layer 520G, and the transmissive layer 530B may include the first to third scattering particles SP1, SP2, and SP3, respectively.

The first color conversion layer 520R may include photosensitive polymer OM in which the first quantum dots QD1 and the first scattering particles SP1 are scattered. The first color conversion layer 520R may convert blue incident light Lib to the first color light Lr. The first quantum dots QD1 of the first color conversion layer 520R may be excited by the blue incident light Lib to isotropically emit the first color light Lr having a wavelength longer than that of the blue light. For example, the first color light Lr may be red light. The first scattering particles SP1 scatter the blue incident light Lib that is not absorbed by the first quantum dots QD1 to excite more of the first quantum dots QD1, thereby increasing a color conversion rate of the first color conversion layer 520R.

The second color conversion layer 520G may include the photosensitive polymer OM in which the second quantum dots QD2 and the second scattering particles SP2 are scattered. The second color conversion layer 520G may convert the blue incident light Lib to second color light Lg. The second quantum dots QD2 of the second color conversion layer 520G may be excited by the blue incident light Lib to isotropically emit the second color light Lg having a wavelength longer than that of blue light. For example, the second color light Lg may be green light. The second scattering particles SP2 scatter the blue incident light Lib that is not absorbed by the second quantum dots QD2 to excite more of the second quantum dots QD2, thereby increasing a color conversion rate of the second color conversion layer 520G.

The first and second quantum dots QD1 and QD2 may be selected from group II-VI compounds, group III-V compounds, group IV-VI compounds, group IV elements, group IV compounds, and any combination thereof. The first quantum dots QD1 may be the same material as the second quantum dots QD2. In one embodiment, a size of each of the first quantum dots QD1 may be the same as that of each of the second quantum dots QD2. In another embodiment, the size of each of the second quantum dots QD2 may be less than the size of each of the first quantum dots QD1.

A transmissive layer 520B may transmit the blue incident light Lib to be emitted in a direction toward the second substrate 500. The transmissive layer 520B may include the photosensitive polymer OM in which the third scattering particles SP3 are scattered.

The photosensitive polymer OM may be light transmissive resin. The light transmissive resin is not particularly limited so far as the light transmissive resin has superior scattering characteristics to the third scattering particles SP3 and exhibits light transmissivity, and may include, for example, acrylic resin, imide-based resin, epoxy-based resin, and the like.

The first to third scattering particles SP1, SP2, and SP3 may be particles having a refractive index different from that of the light transmissive resin. The light scattering particles are not particularly limited so far as the light scattering particles is cable of partially scattering transmissive light by forming an optical interface with the light transmissive resin, and may be, for example, metal oxide particles or organic particles. Examples of the metal oxide may include titanium oxide ($TiO_2$), zirconium oxide ($ZrO_2$), aluminum oxide ($Al_2O_3$), indium oxide ($In_2O_3$), zinc oxide (ZnO), tin oxide ($SnO_2$), and the like. Examples of the organic material may include acrylic resin, urethane-based resin, and the like. The first to third scattering particles SP1, SP2, and SP3 may scatter incident light in various directions regardless of an incident angle without substantially converting the wavelength of the incident light. Accordingly, side visibility may be improved. In an embodiment, the sizes of the first to third scattering particles SP1, SP2, and SP3 may be different from one another.

In the present specification, the quantum dots, for example, the first quantum dots QD1 and the second quantum dots QD2, may mean crystals of a semiconductor compound, and may include a certain material capable of emitting light of various light-emitting wavelengths depending on the size of the crystal.

Each of the quantum dots may have a diameter of, for example, about 1 nm to about 10 nm.

The quantum dot may be synthesized by a wet chemical process, an organic metal chemical deposition process, a molecular epitaxy process, any process similar thereto, and the like.

The wet chemical process is a method of growing quantum dot particle crystals from a mixture of an organic solvent and a precursor material. During the growth of the quantum dot particle crystals, as the organic solvent naturally serves as a dispersant coordinated on a quantum dot crystal surface and controls the growth of the crystals, the growth of quantum dot particles may be controlled through a process that is easier and costs less than a vapor deposition method such as a metal organic chemical vapor deposition (MOCVD) or a molecular beam epitaxy (MBE), and the like.

The quantum dots may include group III-VI semiconductor compounds; group II-VI semiconductor compounds; group III-V semiconductor compounds; group III-V semiconductor compounds; group I-III-VI semiconductor compounds; group IV-VI semiconductor compounds; group IV elements or compounds; or any combination thereof.

Exampled of the group III-VI semiconductor compounds may include two-element compounds such as $In_2S_3$; three-element compounds such as $AgInS$, $AgInS_2$, $CuInS$, $CuInS_2$, and the like; or any combination thereof.

Examples of the group II-VI semiconductor compounds may include two-element compounds such as CdS, CdSe, CdTe, ZnS, ZnSe, ZnTe, ZnO, HgS, HgSe, HgTe, MgSe, MgS, and the like; three-element compounds such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and the like; four-element compounds such as CdZnSeS, CdZnSeTe, CdZnSTe, CdHgSeS, CdHgSeTe, CdHgSTe, HgZnSeS, HgZnSeTe, HgZnSTe, and the like; or any combination thereof.

Examples of the group III-V semiconductor compounds may include two-element compounds such as GaN, GaP, GaAs, GaSb, MN, AlP, AlAs, AlSb, InN, InP, InAs, InSb, and the like; three-element compounds such as GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, GaAlNP, and the like;

four-element compounds such as GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and the like; or any combination thereof. The group III-V semiconductor compounds may further include group II elements. Examples of group III-V semiconductor compounds further including the group II elements may include InZnP, InGaZnP, InAlZnP, and the like.

Examples of the group III-VI semiconductor compound may include two-element compounds such as GaS, GaSe, $Ga_2Se_3$, GaTe, InS, InSe, $In_2Se_3$, InTe, and the like; three-element compounds such as $InGaS_3$, $InGaSe_3$, and the like; or any combination thereof.

Examples of the group I-III-VI semiconductor compounds may include three-element compounds such as AgInS, $AgInS_2$, CuInS, $CuInS_2$, $CuGaO_2$, $AgGaO_2$, $AgA_1O_2$, and the like, or any combination thereof.

Examples of the group IV-VI semiconductor compounds may include two-element compounds such as SnS, SnSe, SnTe, PbS, PbSe, PbTe, and the like; three-element compounds such as SnSeS, SnSeTe, SnSTe, PbSeS, PbSeTe, PbSTe, SnPbS, SnPbSe, SnPbTe, and the like; four-element compounds such as SnPbSSe, SnPbSeTe, SnPbSTe, and the like; or any combination thereof.

The group IV element or compounds may include single element compounds such as Si, Ge, and the like; two-element compounds such as SiC, SiGe, and the like; or any combination thereof.

Each element included in multi-element compounds such as the two-element compounds, the three-element compounds, and the four-element compounds may exist in particles at a uniform concentration or a non-uniform concentration.

The quantum dots may have a single structure or a dual structure of core-shell, in which a concentration of each element included in a corresponding quantum dot is uniform. For example, a material included in the core may be different from a material included in a shell.

The shell of a quantum dot may serve as a protection layer to maintain semiconductor properties by preventing chemical deformation of the core and/or as a charging layer to give electrophoretic properties to the quantum dot. The shell may be a single layer or a multi-layer. An interface of a core and a shell may have a concentration gradient such that the concentration of an element in the shell gradually decreases toward the center thereof.

Examples of the shell of a quantum dot may include metal or non-metal oxides, semiconductor compounds, any combination thereof, and the like. Examples of the metal or non-metal oxides may include two-element compounds such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, NiO, and the like; three-element compounds such as $MgAl_2O_4$, $CoFe_2O_4$, $NiFe_2O_4$, $CoMn_2O_4$, and the like; or any combination thereof. The semiconductor compounds may include, as described in the present specification, group III-VI semiconductor compounds; group II-VI semiconductor compounds; group III-V semiconductor compounds; group III-VI (=III-V?) semiconductor compounds; group I-III-VI semiconductor compounds; group IV-VI semiconductor compounds; or any combination thereof. For example, the semiconductor compounds may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combination thereof.

The quantum dot may have a full width of half maximum (FWHM) of a light-emitting wavelength spectrum of about 45 nm or less, in detail, about 40 nm or less, or about 30 nm or less, in a range of which color purity or color reproducibility. Furthermore, the light emitted through the quantum dots is irradiated in all directions, thereby improving a light viewing angle.

Furthermore, the quantum dot may have a shape of, in detail, a sphere, a pyramid, a multi-arm, a cubic nano particle, a nanotube, a nanowire, a nanofiber, a nano platelet particle, and the like.

As an energy band gap is adjustable by adjusting the size of a quantum dot, light of various wavelength bands may be obtained from a quantum-dot emission layer. Accordingly, by using quantum dots having different sizes, a light-emitting element for emitting light of various wavelengths may be implemented. In detail, the size of a quantum dot may be selected so that red, green, and/or blue light is emitted. Furthermore, the size of a quantum dot may be configured such that white light is emitted by combining light of various colors.

Figure 6:
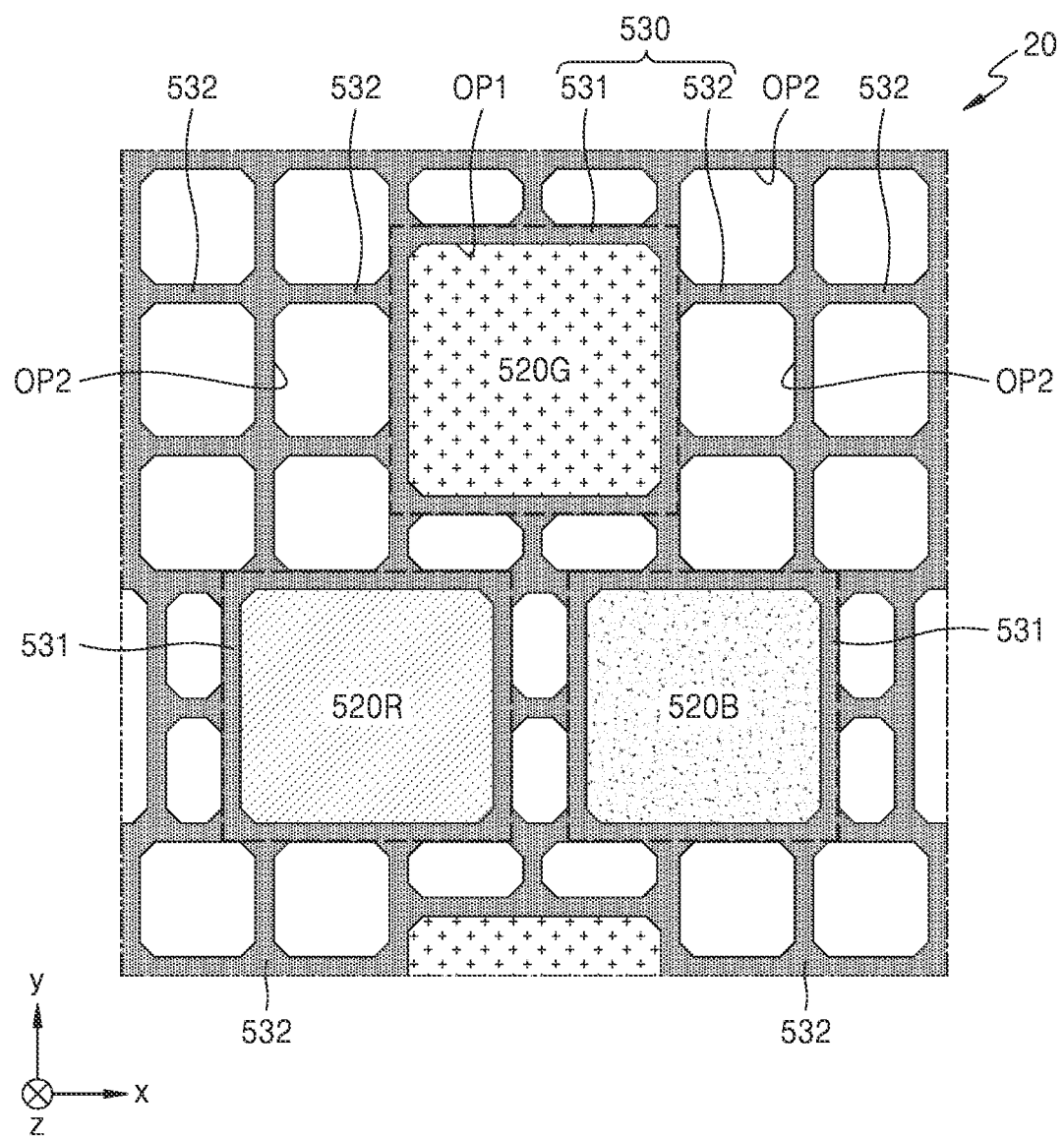
FIG. 6 is a schematic plan view of a color filter substrate according to one or more embodiments.
Figure 8:
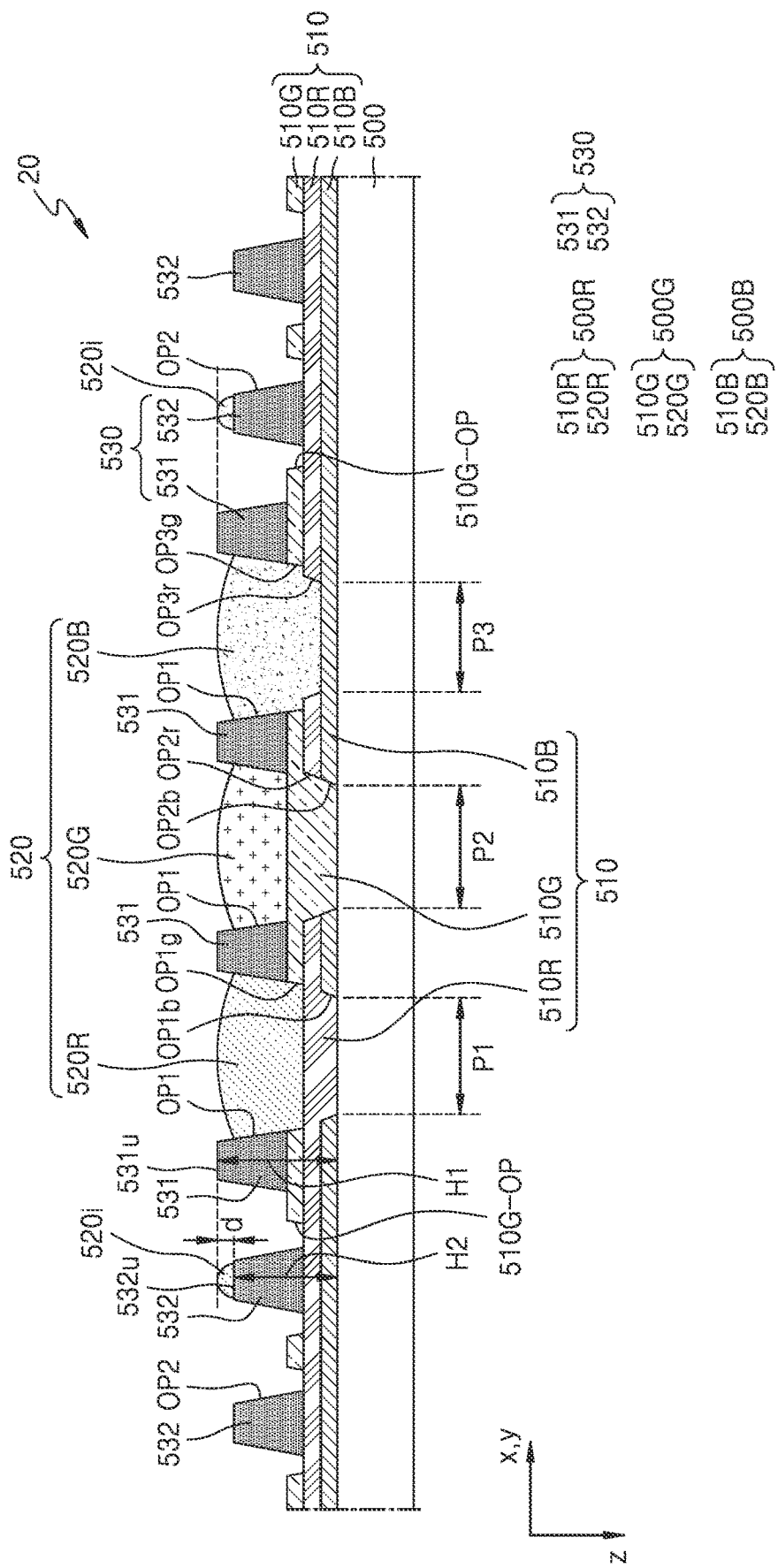

FIG. 6 is a schematic plan view of the color filter substrate 20 according to one or more embodiments. FIGS. 7 and 8 are schematic cross-sectional views of the color filter substrate 20 according to one or more embodiments.

Figure 14:
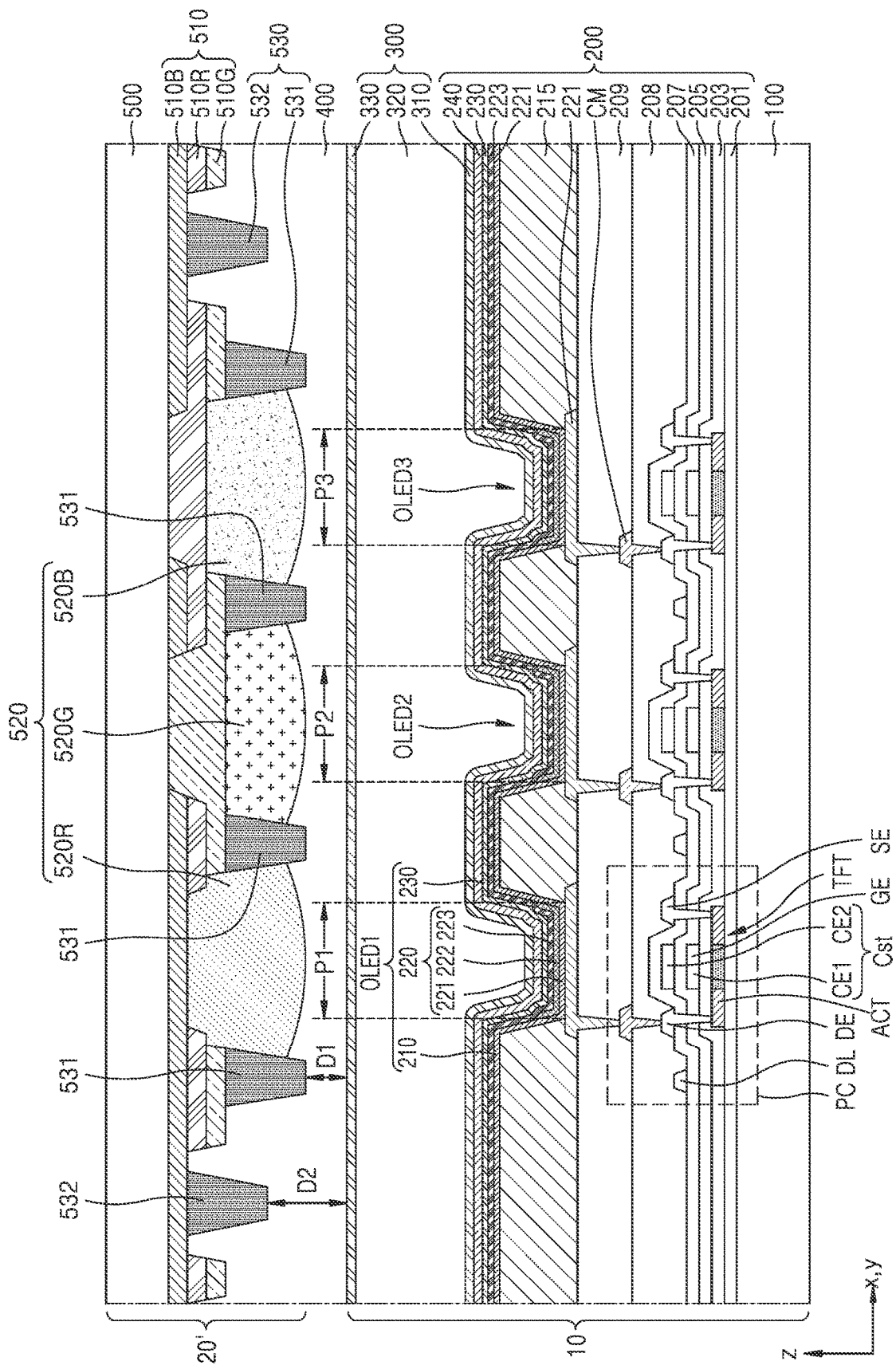
FIG. 14 is a schematic cross-sectional view of a display apparatus according to one or more embodiments.

Referring to FIGS. 6 and 7, the color filter substrate 20 may include the second substrate 500, a color filter layer 510 arranged on the second substrate 500, a color conversion layer 520, and a bank layer 530 for sectioning a first opening OP1 and a second opening OP2. FIGS. 6 and 7 illustrate a structure in which the color filter layer 510, the color conversion layer 520, and the bank layer 530 are arranged on and above the second substrate 500. Actually, in the display apparatus 1, the color filter substrate 20 may be arranged on the display substrate 10, as illustrated in FIG. 14, by being turned upside down based on the illustration of FIGS. 6 and 7.

As illustrated in FIG. 7, the color filter layer 510 may be patterned on the second substrate 500, the bank layer 530 may be formed on the color filter layer 510, and then the color conversion layer 520 is arranged in the first opening OP1 of the bank layer 530. In the following description, for convenience of explanation, the color filter substrate 20 is described based on the structure in which the color filter layer 510, the color conversion layer 520, and the bank layer 530 are arranged on the second substrate 500 according to the manufacturing sequence.

The second substrate 500 may include a glass material or polymer resin. When the second substrate 500 includes polymer resin, the polymer resin may include polyethersulfone, polyacrylate, polyetherimide, polyethylene naphthalate, polyethylene terephthalate, polyphenylene sulfide, polyarylate, polyimide, polycarbonate, or cellulose acetate propionate.

The color filter layer 510 may include a first color filter 510R, a second color filter 510G, and a third color filter 510B which are arranged on the second substrate 500. The first color filter 510R may improve the color gamut of the first color light Lr, the second color filter 510G may improve the color gamut of the second color light Lg, and the third color filter 510B may improve the color gamut of a third color light Lb.

In an embodiment, the third color filter 510B may be arranged on the second substrate 500, the first color filter 510R may be arranged on the third color filter 510B, and the second color filter 510G may be arranged on the first color filter 510R. The arrangement order of the first color filter 510R to the third color filter 510B may be changed in another embodiment.

The first color filter 510R may be arranged to correspond to the first pixel P1 to improve, for example, the color gamut of red light. Accordingly, the second color filter 510G and the third color filter 510B may have openings OP1g and OP1b, respectively, to correspond to the first pixel P1. Furthermore, the second color filter 510G may be arranged to correspond to a second pixel P2 to improve, for example, the color gamut of green light. Accordingly, the first color filter 510R and the third color filter 510B may have openings OP2r and OP2b, respectively, to correspond to the second pixel P2. Furthermore, the third color filter 510B may be arranged to correspond to the third pixel P3 to improve, for example, the color gamut of blue light. Accordingly, the first color filter 510R and the second color filter 510G may have openings OP3r and OP3g, respectively, to correspond to the third pixel P3.

The color filter layer 510 may be arranged even in an area other than an area corresponding to the first pixel P1 to the third pixel P3, that is, a non-light emitting area. The color filter layer 510, which is arranged in the non-light emitting area, may prevent light from under the color filter layer 510 from being leaked to the non-light emitting area through the second opening OP2 of the bank layer 530.

The bank layer 530 may be arranged on the color filter layer 510. The bank layer 530 may be provided to confine the color conversion layer 520 on the color filter layer 510. The bank layer 530 may include an organic material, for example, an organic black matrix. The bank layer 530 may improve color sharpness and contrast. The bank layer 530 may include at least one of a black pigment, a black dye, or black particle in the organic material. In some embodiments, the bank layer 530 may include a material such as Cr or CrOx, Cr/CrOx, Cr/CrOx/CrNy, resin (a carbon pigment or an RGB mixed pigment), graphite, a non-Cr-based material, and the like to adjust optical density.

The bank layer 530 may have the first opening OP1 and the second opening OP2. The first opening OP1 and the second opening OP2 each may include a plurality of openings. The first opening OP1 may be arranged to correspond to each pixel, that is, the first pixel P1 to the third pixel P3. The light emitted through the first pixel P1 to the third pixel P3 may be irradiated outside the second substrate 500 through the first opening OP1.

The second opening OP2 may be arranged to correspond to an area other than a light-emitting area corresponding to each pixel, that is, non-light emitting area. The second opening OP2 may be arranged around the first opening OP1 to be adjacent to the first opening OP1. As described above, the color conversion layer 520 may be arranged in the first opening OP1. The color conversion layer 520 may be formed in the first opening OP1 using an inkjet method. In some cases, ink for forming the color conversion layer 520, which is to be ejected into the first opening OP1, may overflow around the first opening OP1, or may be ejected to a portion that is not the first opening OP1 due to a misalignment between the inkjet nozzle and the first opening OP1. In this case, the second opening OP2 may be arranged adjacent to the first opening OP1 to reduce defects due to the misalignment between the inkjet nozzle and the first opening OP1.

In an embodiment, the size of the second opening OP2 may be less than the size of the first opening OP1. The size of the first opening OP1 may be set to correspond to the size of each pixel, and the second opening OP2 may be less than the size of the first opening OP1. As described above, the second opening OP2 may reduce defects in the color filter substrate 20 when the ink for forming the color conversion layer 520 is erroneously ejected in areas other than the first opening OP1.

In the present embodiment, the bank layer 530 may include a first bank portion 531 that surround the first opening OP1 and a second bank portion 532 that surround the second opening OP2. Referring to FIG. 6, the first bank portion 531 may mean an edge portion for defining the first opening OP1, and the second bank portion 532 may mean a portion other than the first bank portion 531 in the bank layer 530. Accordingly, some of the second openings OP2 disposed adjacent to the first opening OP1 may be defined by the first bank portion 531 which is disposed between the first opening OP1 and the second opening OP2, and the second bank portion 532.

In an embodiment, a second height H2 from the upper surface of the second substrate 500 to an upper surface 532u of the second bank portion 532 may be less than a first height H1 from the upper surface of the second substrate 500 to an upper surface 531u of the first bank portion 531. The "upper surface" of the first bank portion 531 and the second bank portion 532 is a surface disposed farther away from the surface of the second substrate 500.

As described above, although the ink for forming the color conversion layer 520 is supposed to be ejected within the first opening OP1, in some cases, it is a problem that the ink 520i (See, FIG. 8) for forming the color conversion layer 520 is erroneously ejected to a portion other than the first opening OP1 which is described with reference to FIG. 8. When the ink 520i for forming the color conversion layer 520 is ejected within the second opening OP2, the ink does not affect the display apparatus 1. However, as illustrated in the second substrate 500 of FIG. 8, the ink 520i for forming the color conversion layer 520 may be ejected onto an upper surface of the bank layer 530, that is, the upper surface 532u of the second bank portion 532.

In a comparative example, because the height of a bank layer is equal in the entire surface of a color filter substrate, that is, a first height from a second substrate to an upper surface of a first bank portion is equal to a second height from the second substrate to an upper surface of a second bank portion, when ink for forming a color conversion layer is erroneously ejected onto the second bank portion, an inorganic film of a thin film encapsulation layer of a display substrate may be damaged due to the ink disposed on the second bank portion. Thus, a sealing force of the thin film encapsulation layer may be deteriorated due to the ink disposed on the second bank portion, thereby generating defects such as black spots and the like.

Accordingly, in the display apparatus 1 according to one or more embodiments, as the second height H2 from the upper surface of the second substrate 500 to the upper surface 532u of the second bank portion 532 is provided to be less than the first height H1 from the upper surface of second substrate 500 to the upper surface 531u of the first bank portion 531, in some cases, even when the ink 520i for forming the color conversion layer 520 is erroneously ejected onto the upper surface of the bank layer 530, that is, the upper surface 532u of the second bank portion 532, the display substrate 10 may not be affected, thereby reducing or preventing generation of defects.

Referring to FIG. 8, there may be a step d between the upper surface 531u of the first bank portion 531 and the upper surface 532u of the second bank portion 532. In an embodiment, the step d may be about 3.5 µm or more, for example, 7 µm or more. As such, the step d between the upper surface 531u of the first bank portion 531 and the upper surface 532u of the second bank portion 532 may be implemented by removing a part of the color filter layer 510 provided between the second bank portion 532 and the second substrate 500.

In detail, to form the second height H2 from the upper surface of the second substrate 500 to the upper surface 532u of the second bank portion 532 to be less than the first height H1 from the upper surface of the second substrate 500 to the upper surface 531u of the first bank portion 531, a part of the color filter layer 510 corresponding to the second bank portion 532 may be removed. In an embodiment, at least one of the first color filter 510R, the second color filter 510G, and the third color filter 510B may not be provided between the second substrate 500 and the second bank portion 532.

For example, as illustrated in FIGS. 7 and 8, the second color filter 510G may have an opening 510G-OP in an area corresponding to the second bank portion 532. Accordingly, while the first color filter 510R, the second color filter 510G, and the third color filter 510B are provided between the second substrate 500 and the first bank portion 531, the first color filter 510R and the third color filter 510B, except the second color filter 510G, may be arranged between the second substrate 500 and the second bank portion 532.

In an embodiment, each of the first color filter 510R, the second color filter 510G, and the third color filter 510B may be formed to have a thickness of about 3.5 µm. Whenever one layer of the first color filter 510R, the second color filter 510G, and the third color filter 510B is removed, the second height H2 may be reduced by about 3.5 µm. As such, by removing at least one of the first color filter 510R, the second color filter 510G, and the third color filter 510B from the area corresponding to the second bank portion 532, the second height H2 of the second bank portion 532 may be reduced without a process change or an additional process.

At least part of the color filter layer 510 may be arranged in the second opening OP2. The first color filter 510R, the second color filter 510G, and the third color filter 510B may be arranged to overlap one another in the area corresponding to the second opening OP2. The first color filter 510R, the second color filter 510G and the third color filter 510B may be provided between the second substrate 500 and the first bank layer 531, and the first color filter 510R may be exposed through the second opening OP2. The second color filter 510G may be patterned to be arranged on the first color filter 510R exposed through the second opening OP2. The second opening OP2 is provided in an area correspond to the non-light emitting area other than the light-emitting area of each of the first to third pixels P1, P2, and P3. As the first color filter 510R, the second color filter 510G, and the third color filter 510B are arranged to overlap each other in the area correspond to the second opening OP2, light may be prevented from being leaked to the non-light emitting area through the second opening OP2.

In a comparative example, when some of a first color filter, a second color filter, and a third color filter are not arranged in an area correspond to a second opening, for example, only the third color filter is arranged in the area correspond to the second opening, color mixing between neighboring pixels may occur and colors may be distorted.

Figure 9:
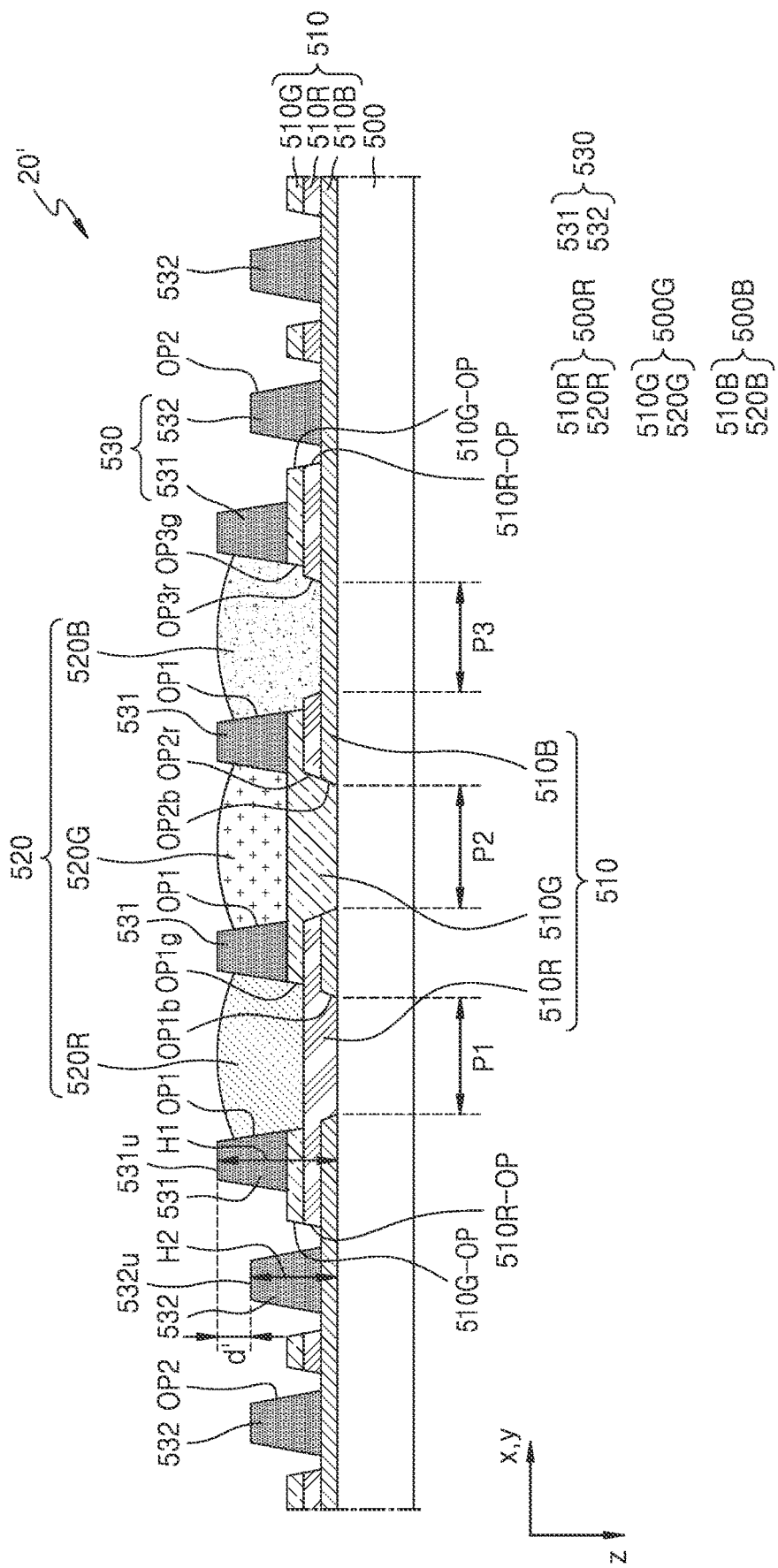
FIGS. 9, 10 and 11 are schematic cross-sectional views of a color filter substrate according to one or more embodiments.
Figure 10:
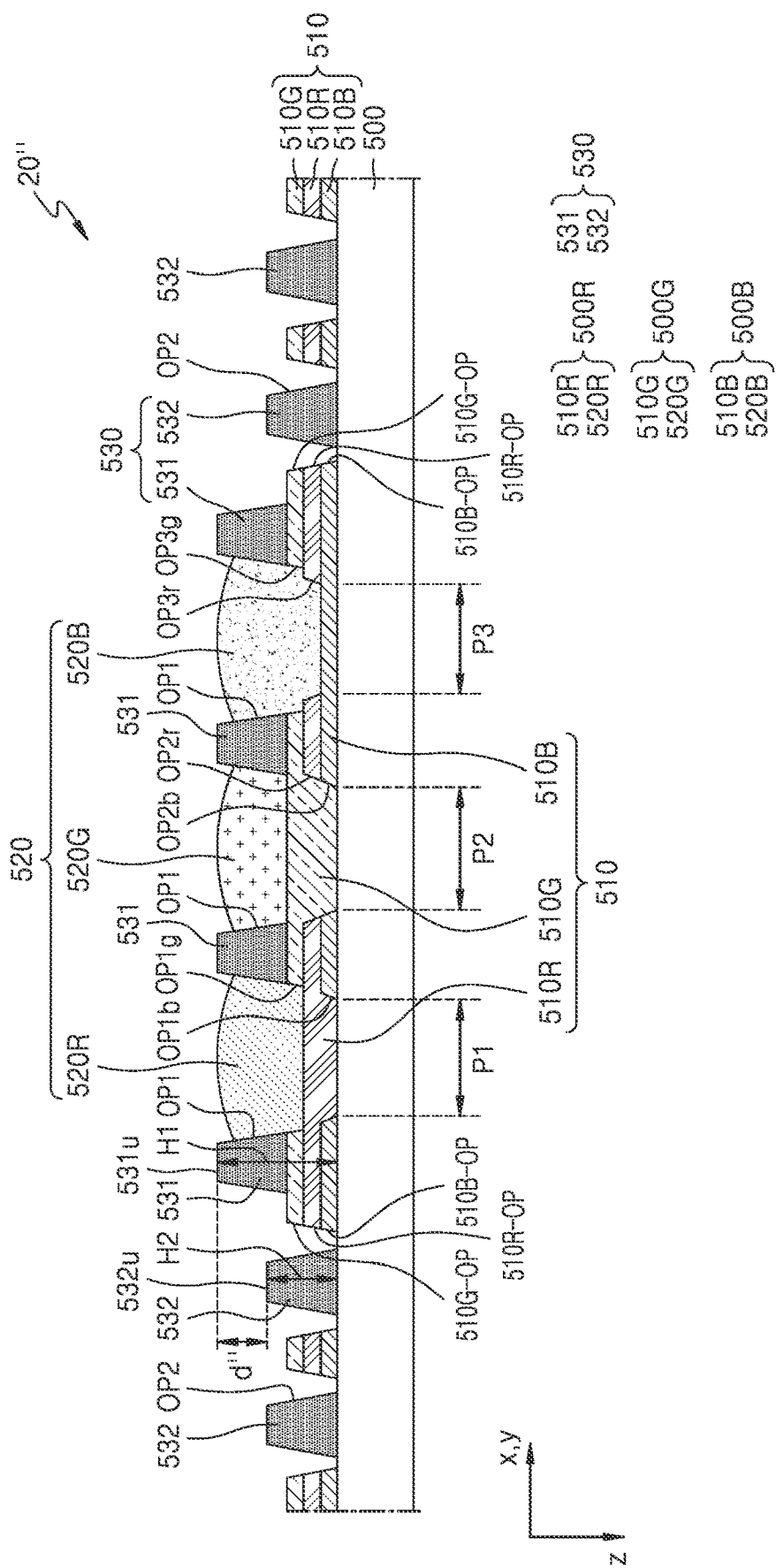
Figure 11:
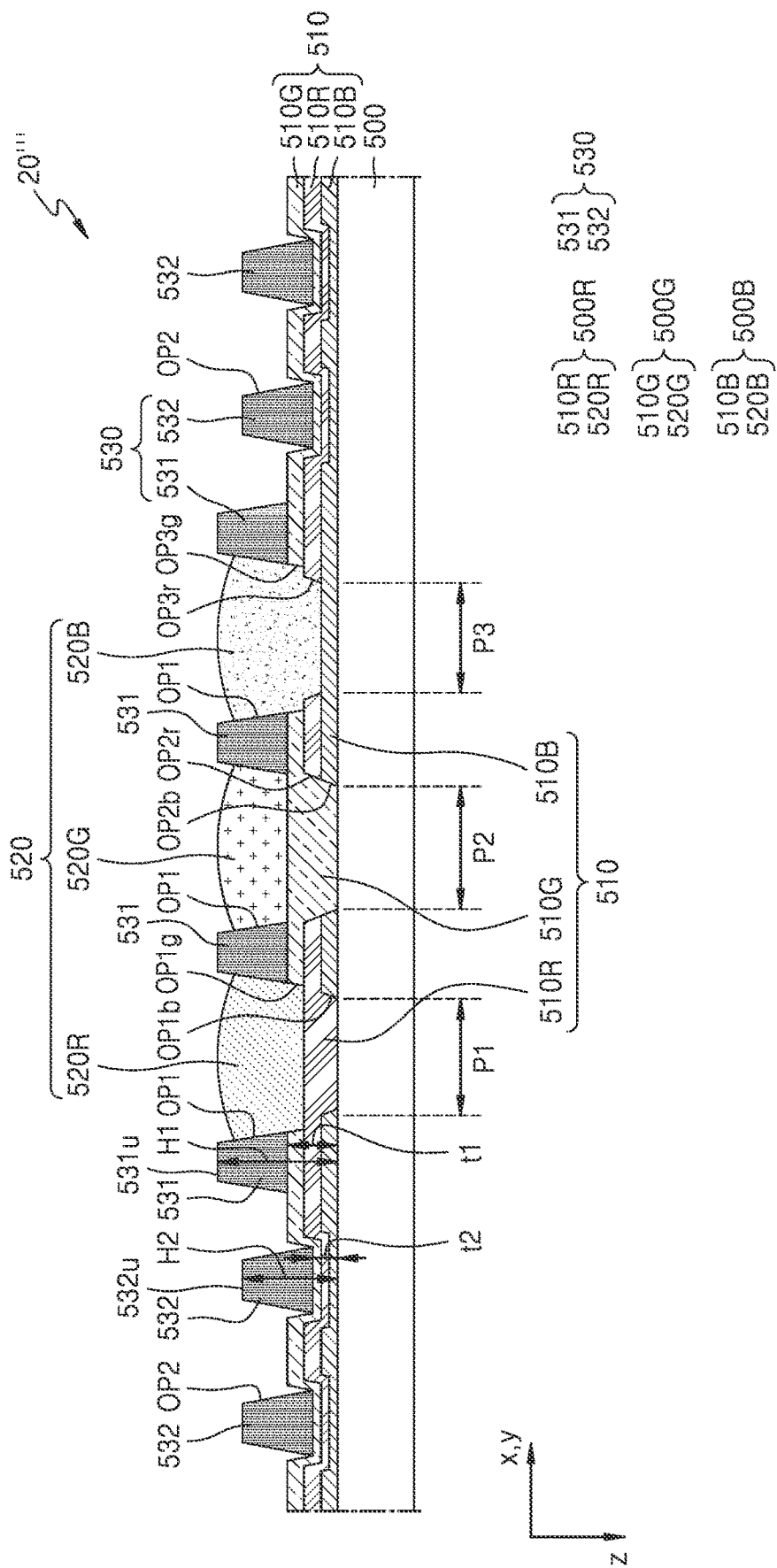

FIGS. 9 to 11 are schematic cross-sectional views of color filter substrates 20', 20", and 20'" according to one or more embodiments.

The color filter substrates 20' and 20" of FIGS. 9 and 10 are modifications of the color filter substrate 20 of FIG. 7. The color filter substrates 20' and 20" of FIGS. 9 and 10 differ from the above-described color filter substrate 20 of FIG. 7 in the structure of the color filter layer 510 corresponding to the second bank portion 532. In the following description, differences from the above-described color filter substrate 20, except redundant descriptions, are mainly described.

Referring to FIG. 9, in the color filter substrate 20', the second height H2 from the upper surface of the second substrate 500 to the upper surface 532u of the second bank portion 532 may be less than the first height H1 from the upper surface of the second substrate 500 to the upper surface 531u of the first bank portion 531. A step d' may exist between the upper surface 531*u* of the first bank portion 531 and the upper surface 532*u* of the second bank portion 532. In an embodiment, the step d' may be about 7 µm or more. As such, the step d' between the upper surface 531*u* of the first bank portion 531 and the upper surface 532*u* of the second bank portion 532 may be implemented by removing a part of the color filter layer 510 provided between the second bank portion 532 and the second substrate 500.

In the present embodiment, a part of the color filter layer 510 in a region corresponding to the second bank portion 532, for example, the first color filter 510R and the second color filter 510G, may be removed. The first color filter 510R and the second color filter 510G may have openings 510R-OP and 510G-OP in a region corresponding to the second bank portion 532. Accordingly, the third color filter 510B only may be arranged between the second substrate 500 and the second bank portion 532.

Referring to FIG. 10, in the color filter substrate 20", the second height H2 from the upper surface of the second substrate 500 to the upper surface 532*u* of the second bank portion 532 may be less than the first height H1 from the upper surface of the second substrate 500 to the upper surface 531*u* of the first bank portion 531. A step d" may exist between the upper surface 531*u* of the first bank portion 531 and the upper surface 532*u* of the second bank portion 532. In an embodiment, the step d" may be about 10.5 µm or more. As such, the step d" between the upper surface 531*u* of the first bank portion 531 and the upper surface 532*u* of the second bank portion 532 may be implemented by removing the color filter layer 510 provided between the second bank portion 532 and the second substrate 500.

In the present embodiment, the color filter layer 510 disposed in a region corresponding to the second bank portion 532, for example, the first color filter 510R, the second color filter 510G, and the third color filter 510B, may be removed. The first color filter 510R, the second color filter 510G, and the third color filter 510B may have openings 510R-OP, 510G-OP, and 510B-OP in the region corresponding to the second bank portion 532. The second substrate 500 may be exposed through the openings 510R-OP, 510G-OP, and 510B-OP, and the second bank portion 532 may be arranged directly on the second substrate 500.

As the color filter substrates 20' and 20" of FIGS. 9 and 10 respectively have the steps d' and d", which are height differences from the second substrate 500 to the upper surface of the first bank portion 531 and from the second substrate 500 to the upper surface of the second bank portion 532, respectively, that are greater than that of the above-described color filter substrate 20 of FIG. 7, even when a misalignment between the inkjet nozzle and the first opening OP1 occurs on the upper surface 532*u* of the second bank portion 532, the display substrate 10 is not affected thereby so that generation of defects may be reduced or prevented.

The color filter substrate 20''' of FIG. 11 differs from the above-described color filter substrates 20, 20', and 20" in the structure of the color filter layer 510 between the second bank portion 532 and the second substrate 500.

Referring to FIG. 11, the color filter layer 510 may be provided between the first bank portion 531 and the second substrate 500, and between the second bank portion 532 and the second substrate 500. In the present embodiment, the second height H2 from the upper surface of the second substrate 500 to the upper surface 532*u* of the second bank portion 532 may be less than the first height H1 from the upper surface of the second substrate 500 to the upper surface 531*u* of the first bank portion 531. Accordingly, a second thickness t2 of the color filter layer 510 provided between the second bank portion 532 and the second substrate 500 may be less than a first thickness t1 of the color filter layer 510 provided between the first bank portion 531 and the second substrate 500.

In an embodiment, the thickness of the color filter layer 510 disposed in a region corresponding to the second bank portion 532, for example, at least one of the first color filter 510R, the second color filter 510G, and the third color filter 510B may be less than the thickness of the color filter layer 510 disposed in a region corresponding to the first bank portion 531, for example, at least one of the first color filter 510R, the second color filter 510G, and the third color filter 510B. In FIG. 11, the thickness of each of the first color filter 510R, the second color filter 510G, and the third color filter 510B in the second bank portion 532 is less than the thickness thereof in the first bank portion 531.

The color filter substrate 20''' of FIG. 11 may have a step which is not formed by completely removing at least one of the first color filter 510R, the second color filter 510G, and the third color filter 510B in a region corresponding to the second bank portion 532 but formed by reducing a thickness of at least one of the first color filter 510R, the second color filter 510G, and the third color filter 510B in a region corresponding to the second bank portion 532. To reduce the thickness of the first color filter 510R, the second color filter 510G, and the third color filter 510B in a region corresponding to the second bank portion 532 a half-tone mask may be used.

In another embodiment, the thickness of the color filter layer 510 may be selectively reduced in an area where the step is to be decreased among the second bank portion 532. Although FIG. 11 illustrates that the thickness of the color filter layer 510 is formed to be relatively thin in all areas where the second bank portion 532 is located, the step of the second bank portion 532 may be selectively adjusted by reducing the thickness of the color filter layer 510 in an area corresponding to the second bank portion 532 which has a relatively large area.

Figure 12:
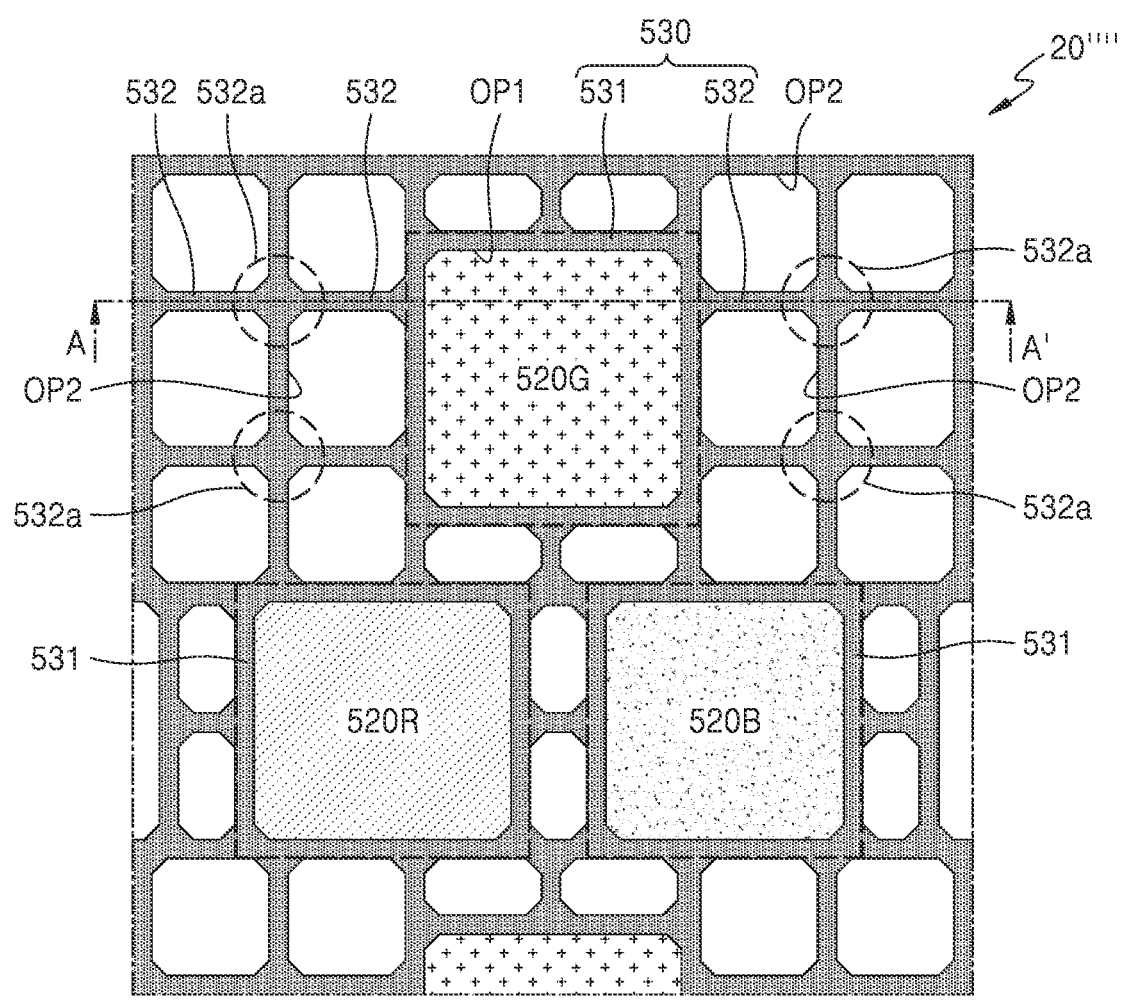
FIG. 12 is a schematic plan view of a color filter substrate according to one or more embodiments.
Figure 13:
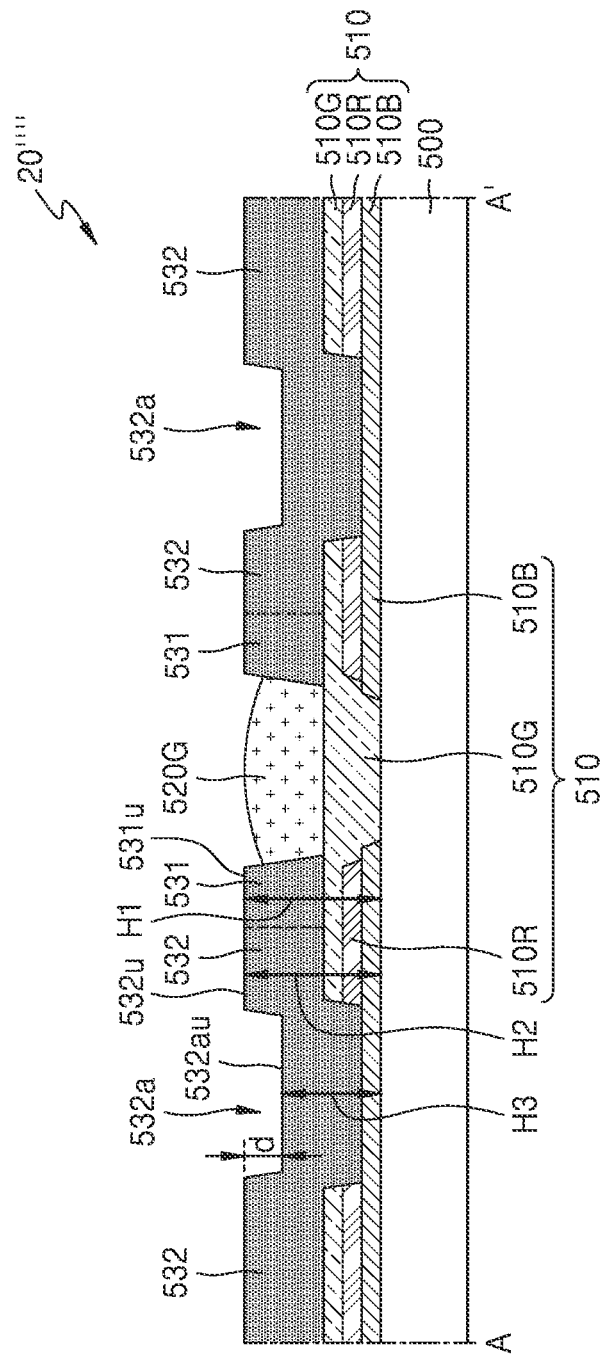
FIG. 13 is a schematic cross-sectional view of a color filter substrate according to one or more embodiments.

FIG. 12 is a schematic plan view of a color filter substrate 20'''' according to one or more embodiments. FIG. 13 is a schematic cross-sectional view of the color filter substrate 20'''' according to one or more embodiments. FIG. 13 is a cross-sectional view taken along line A-A" of FIG. 12.

Referring to FIGS. 12 and 13, a planar structure of the color filter substrate 20'''' is the same as that of the above-described structure of FIG. 6, but differs in a cross-sectional structure of the second bank portion 532. In the color filter substrate 20'''' of FIG. 12, the second bank portion 532 may include a branch portion 532*a* in which the second bank portions extending in different directions cross each other. In the second bank portion 532, the branch portion 532*a* may mean a portion having a "+" shape to section the second openings OP2. For example, four second openings OP2 may be arranged adjacent to the branch portion 532*a*.

In the second bank portion 532, the branch portion 532*a* may have a relatively large width than the remaining portion of the second bank portion 532. Accordingly, as described above, when the ink 520*i* for forming the color conversion layer 520 is erroneously ejected to a portion other than the first opening OP1, the ink may be relatively highly likely to be ejected to the branch portion 532*a* of the second bank portion 532. Accordingly, it is more important to decrease the step d in the branch portion 532*a* that has a relatively large width than the remaining area thereof.

Accordingly, in the color filter substrate 20'''' according to one or more embodiments, the step d may be provided in the branch portion 532a of the second bank portion 532. Referring to FIG. 12, in the color filter substrate 20'''', a third height H3 from the upper surface of the second substrate 500 to an upper surface 532au of the branch portion 532a may be less than the second height H2 from the upper surface of the second substrate 500 to the upper surface 532u of the second bank portion 532 except the branch portion 532a. Accordingly, the step d may exist between the upper surface 532u of the second bank portion 532 except the branch portion 532a and the upper surface 532au of the branch portion 532a. In the second substrate 500, the first height H1 from the upper surface of the second substrate 500 to the upper surface 531u of the first bank portion 531 may be the same as the second height H2 from the upper surface of the second substrate 500 to the upper surface 532u of the second bank portion 532 except the branch portion 532a.

As described above, as the bank layer 530 has the step d in a region corresponding to the branch portion 532a, which relatively increases a distance from the thin film encapsulation layer 300 of FIG. 14 to the bank layer 530, even when the ink 520i for forming the color conversion layer 520 is erroneously ejected to the branch portion 532a, the damage to the thin film encapsulation layer 300 due to the ink erroneously ejected on the branch portion 532a may be prevented.

FIG. 14 is a schematic cross-sectional view of a display apparatus according to one or more embodiments.

Although the display apparatus of FIG. 14 is illustrated to include the color filter substrate 20' of FIG. 9, it is possible to apply the above-described color filter substrates 20, 20', 20'', 20''', and 20'''' to the display apparatus according to one or more embodiments.

Referring to FIG. 14, the first to third pixels P1, P2, and P3 may be arranged on the first substrate 100. The first to third pixels P1, P2, and P3 may respectively include first to third light-emitting devices and the pixel circuit PC, and each of the first to third light-emitting devices may be electrically connected to the pixel circuit PC, thereby controlling emission of light. In the present embodiment, the first to third light-emitting devices may be first to third organic light-emitting diodes OLED1, OLED2, and OLED3, respectively. In an embodiment, the first to third organic light-emitting diodes OLED1, OLED2, and OLED3 may be organic light-emitting diodes that emit blue light.

In the following description, the pixel circuit PC included in each of the first to third pixels P1, P2, and P3 has the same structure, and thus a stack structure of one pixel is described below.

First, the first substrate 100 may include a glass material or polymer resin. In an embodiment, the first substrate 100 may include a plurality of sub-layers. The sub-layers may have a structure in which an organic layer and an inorganic layer are alternately stacked. When the first substrate 100 includes polymer resin, the first substrate 100 may include polyethersulfone, polyacrylate, polyetherimide, polyethylene naphthalate, polyethylene terephthalate, polyphenylene sulfide, polyarylate, polyimide, polycarbonate or cellulose acetate propionate.

A display layer 200 including a light-emitting device (OLED1, OLED2 and OLED3) and a thin film encapsulation layer (300) covering the display layer 200 may be arranged on the first substrate 100. The display layer 200 is described below in detail.

A buffer layer 201 for preventing impurities from infiltrating into a semiconductor layer ACT of a thin film transistor TFT may be formed on the first substrate 100. The buffer layer 201 may include an inorganic insulating material such as silicon nitride, silicon oxynitride, and silicon oxide, and may be a single layer or multilayer including the above-described inorganic insulating material.

The pixel circuit PC may be arranged on the buffer layer 201. The pixel circuit PC may be arranged to correspond to each of the pixels P. The pixel circuit PC may include the thin film transistor TFT and the storage capacitor Cst. The thin film transistor TFT may include the semiconductor layer ACT, a gate electrode GE, a source electrode SE, and a drain electrode DE.

Although not illustrated in FIG. 5, the data line DL of the pixel circuit PC is electrically connected to a switching thin film transistor included in the pixel circuit PC. Although, in the present embodiment, a top gate type thin film transistor TFT is illustrated, in which the gate electrode GE is arranged on the semiconductor layer ACT with a gate insulating layer 203 disposed therebetween, according to another embodiment, the thin film transistor TFT may be of a bottom gate type thin film transistor TFT.

The semiconductor layer ACT may include poly silicon. Alternatively, the semiconductor layer ACT may include amorphous silicon, an oxide semiconductor, an organic semiconductor, and the like.

The gate electrode GE may include a low resistance metal material. The gate electrode GE may include a conductive material including molybdenum (Mo), aluminum (Al), copper (Cu), titanium (Ti), and the like, and may be formed in a multilayer or single layer including the above material.

The gate insulating layer 203 disposed between the semiconductor layer ACT and the gate electrode GE may include an inorganic insulating material such as silicon oxide, silicon nitride, silicon oxynitride, aluminum oxide, titanium oxide, tantalum oxide, and hafnium oxide, and the like. The gate insulating layer 203 may be a single layer or multilayer including the above-described material.

The source electrode SE and the drain electrode DE may be located on the same layer as the data line DL, and may include the same material as the data line DL. The source electrode SE, the drain electrode DE, and the data line DL may include a material having excellent conductivity. The source electrode SE and the drain electrode DE may include a conductive material including Mo, Al, Cu, Ti, and the like, and may be formed in a multilayer or single layer including the above material. For example, the source electrode SE, the drain electrode DE, and the data line DL may be formed in a multilayer of Ti/Al/Ti.

The storage capacitor Cst may include the first electrode CE1 and the second electrode CE2 overlapping each other with a first interlayer insulating layer 205 interposed therebetween. The storage capacitor Cst may overlap the thin film transistor TFT. In this regard, FIG. 14 illustrates that the gate electrode GE of the thin film transistor TFT is the first electrode CE1 of the storage capacitor Cst. In another embodiment, the storage capacitor Cst may not overlap the thin film transistor TFT. The storage capacitor Cst may be covered by a second interlayer insulating layer 207. The second electrode CE2 of the storage capacitor Cst may include a conductive material including Mo, Al, Cu, Ti, and the like, and may be formed in a multilayer or single layer including the above material.

The first interlayer insulating layer 205 and the second interlayer insulating layer 207 may include an inorganic insulating material such as silicon oxide, silicon nitride, silicon oxynitride, aluminum oxide, titanium oxide, tantalum oxide, hafnium oxide, and the like. The first interlayer insulating layer 205 and the second interlayer insulating layer 207 may be a single layer or multilayer including the above-described material.

The pixel circuit PC including the thin film transistor TFT and the storage capacitor Cst may be covered by a first planarization insulating layer 208. The first planarization insulating layer 208 may have an upper surface that is approximately flat.

A third interlayer insulating layer (not shown) may be further arranged below the first planarization insulating layer 208. The third interlayer insulating layer may include an inorganic insulating material such as silicon oxide, silicon nitride, or silicon oxynitride.

The pixel circuit PC may be electrically connected to a pixel electrode 210. For example, as illustrated in FIG. 5, a contact metal CM may be provided between the thin film transistor TFT and the pixel electrode 210. The contact metal CM may be connected to the thin film transistor TFT via a contact hole formed in the first planarization insulating layer 208, and the pixel electrode 210 may be connected to the contact metal CM via a contact hole formed in a second planarization insulating layer 209. The contact metal CM may include a conductive material including Mo, Al, Cu, Ti, and the like, and may be formed in a multilayer or single layer including the above material. In an embodiment, the contact metal CM may be formed in a multilayer of Ti/Al/Ti.

The first planarization insulating layer 208 and the second planarization insulating layer 209 may include organic insulating materials such as general purpose polymers such as polymethylmethacrylate (PMMA) or polystyrene (PS), polymer derivatives having a phenolic group, acrylic polymers, imide-based polymers, arylether-based polymers, amide-based polymers, fluorine-based polymers, p-xylene-based polymers, vinyl alcohol-based polymers, and blends thereof. In an embodiment, the first planarization insulating layer 208 and the second planarization insulating layer 209 may include polyimide.

The first to third organic light-emitting diodes OLED1, OLED2, and OLED3 may be arranged on the second planarization insulating layer 209. In an embodiment, each of the first to third organic light-emitting diodes OLED1, OLED2, and OLED3 may include the pixel electrode 210, a first common layer 221, an emission layer 222, a second common layer 223, and a counter electrode 230. In the first to third organic light-emitting diodes OLED1, OLED2, and OLED3, the pixel electrode 210 and the emission layer 222 are patterned for each pixel, and the first common layer 221, the second common layer 223 and the counter electrode 230 are integrally provided in the display area DA. In another embodiment, when the first to third organic light-emitting diodes OLED1, OLED2, and OLED3 emit light of the same color, for example, blue, the emission layer 222 may also be provided integrally within the display area DA.

The pixel electrode 210 may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). In another embodiment, the pixel electrode 210 may include a reflective film including silver (Ag), magnesium (Mg), aluminum (Al), platinum (Pt), palladium (Pd), gold (Au), nickel (Ni), neodymium (Nd), iridium (Ir), chromium (Cr), or compounds thereof. In another embodiment, the pixel electrode 210 may further include a film including ITO, IZO, ZnO, or $In_2O_3$ above and/or below the above-described reflective film.

A pixel defining layer 215 may be formed on the pixel electrode 210. The pixel defining layer 215 may include an opening that exposes an upper surface of the pixel electrode 210, and cover edges of the pixel electrode 210. The pixel defining layer 215 may include an organic insulating material or an inorganic insulating material such as silicon nitride, silicon oxynitride, or silicon oxide. Alternatively, the pixel defining layer 215 may include an organic insulating material and an inorganic insulating material.

An intermediate layer 220 may include the emission layer 222. The emission layer 222 may include a polymer or low molecular weight organic material that emits light of a certain color.

Furthermore, the intermediate layer 220 may include the first common layer 221 arranged between the emission layer 222 and the pixel electrode 210, and/or the second common layer 223 arranged between the emission layer 222 and the counter electrode 230.

The first common layer 221 may be a single layer or multilayer. For example, when the first common layer 221 includes a polymer material, the first common layer 221, as a hole transport layer (HTL) that is a single layer structure, may include poly-(3,4)-ethylene-dihydroxy thiophene (PEDOT) or polyaniline (PANI). When the first common layer 221 includes a low molecular weight material, the first common layer 221 may include a hole injection layer (HIL) and a HTL.

The second common layer 223 is not always provided. For example, when the first common layer 221 and the emission layer 222 include a polymer material, the second common layer 223 may be formed. The second common layer 223 may be a single layer or multilayer. The second common layer 223 may include an electron transport layer (ETL) and/or an electron injection layer (EIL).

The counter electrode 230 may include a conductive material having a low work function. For example, the counter electrode 230 may include a (semi-)transparent layer including Ag, Mg, Al, Pt, Pd, Au, Ni, Nd, Ir, Cr, lithium (Li), calcium (Ca), an alloy thereof, and the like. Alternatively, the counter electrode 230 may further include a layer such as ITO, IZO, ZnO, or $In_2O_3$ on a (semi-)transparent layer including the above-described material.

A capping layer 240 may be located on the counter electrode 230. For example, the capping layer 240 may be provided as a single layer or multilayer including a material selected from among an organic material, an inorganic material, and a mixture thereof. In an optional embodiment, a LiF layer may be located on the capping layer 240.

As the first to third organic light-emitting diodes OLED1, OLED2, and OLED3 may be easily damaged by external moisture, oxygen, and the like, the first to third organic light-emitting diodes OLED1, OLED2, and OLED3 may be covered and protected by a thin film encapsulation layer 300. The thin film encapsulation layer 300 may cover the display area DA and extend to a non-display area outside the display area DA. The thin film encapsulation layer 300 may include at least one organic encapsulation layer and at least one inorganic encapsulation layer. For example, the thin film encapsulation layer 300 may include a first inorganic encapsulation layer 310, the organic encapsulation layer 320, and a second inorganic encapsulation layer 330.

The first inorganic encapsulation layer 310 may cover the counter electrode 230, and include silicon nitride, silicon oxynitride, or silicon oxide.

As the first inorganic encapsulation layer 310 is formed along a structure thereunder, an upper surface of the first inorganic encapsulation layer 310 may not be flat. The organic encapsulation layer 320 may cover the first inorganic encapsulation layer 310 to approximately planarize an upper surface of the first inorganic encapsulation layer 310. The organic encapsulation layer 320 may include one or more materials selected from the group consisting of polyethylene terephthalate, polyethylene naphthalate, polycarbonate, polyimide, polyethylene sulfonate, polyoxymethylene, polyarylate, hexamethyldisiloxane, and acrylic resin, for example, polymethylmethacrylate, polyacryl acid, and the like.

The second inorganic encapsulation layer 330 may cover the organic encapsulation layer 320 and include silicon nitride, silicon oxynitride, or silicon oxide.

Even when cracks are generated in the thin film encapsulation layer 300 through the above-described multilayer structure, the thin film encapsulation layer 300 may prevent the generated cracks from being connected to each other between the first inorganic encapsulation layer 310 and the organic encapsulation layer 320, or between the organic encapsulation layer 320 and the second inorganic encapsulation layer 330. Accordingly, the formation of a path through which external moisture, oxygen, and the like infiltrates into the display area DA may be prevented or reduced.

The color filter substrate 20' may be arranged on the thin film encapsulation layer 300. The color filter substrate 20' may be arranged to face the display substrate 10. The color filter substrate 20' illustrated in FIG. 14 is the same as that illustrated in FIG. 9.

A filler 400 may be further provided between the display substrate 10 and the color filter substrate 20'. The filler 400 may be a buffer layer which absorbs external pressure and the like. The filler 400 may include an organic material such as methyl silicone, phenyl silicone, polyimide, and the like. However, the disclosure is not limited thereto, and the filler 400 may include an organic sealant such as urethane-based resin, epoxy-based resin, acrylic resin, and the like, or an inorganic sealant such as silicon and the like.

As described above, the color filter substrate 20' of FIG. 14 is in the form of the color filter substrate 20' of FIG. 9 that is turned upside down. In other words, the display apparatus 1 is obtained by manufacturing the color filter substrate 20' on the second substrate 500 and then combining the color filter substrate 20' with the display substrate 10. Accordingly, with respect to the display apparatus 1, the bank layer 530 may have a shape protruding toward the display substrate 10. Accordingly, the bank layer 530 may have a structure that is arranged most adjacent to the thin film encapsulation layer 300 of the display substrate 10.

According to the present embodiment, the bank layer 530 may be arranged corresponding to the non-light emitting area and may include the first opening OP1 and the second opening OP2 disposed around the first opening OP1 which is disposed in a region corresponding to the first to third organic light-emitting diodes OLED1, OLED2, and OLED3. The second opening OP2 may be provided to correspond to the non-light emitting area. The bank layer 530 may include the first bank portion 531 that surrounds the first opening OP1 and the second bank portion 532 that surrounds the second opening OP2.

In an embodiment, a distance D2 from the upper surface of the thin film encapsulation layer 300, for example, the second inorganic encapsulation layer 330, to the second bank portion 532 may be greater than a distance D1 from the upper surface of the thin film encapsulation layer 300 to the first bank portion 531. As such, as the distance D2 from the second inorganic encapsulation layer 330 to the second bank portion 532 is sufficiently greater than the distance D1 from the second inorganic encapsulation layer 330 to the first bank portion 531, during formation of the color filter substrate 20', even when the ink 520i for forming the color conversion layer 520 is erroneously ejected onto the second bank portion 532, the damage to the second inorganic encapsulation layer 330 of the thin film encapsulation layer 300 due to the erroneously ejected ink may be prevented.

According to an embodiment of the disclosure configured as above, display apparatuses having improved display quality may be implemented. The scope of the disclosure is not limited by the above effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
   a display substrate comprising a first substrate and a light-emitting element disposed on the first substrate; and
   a color filter substrate disposed to face the display substrate,
   wherein the color filter substrate comprises:
   a second substrate;
   a color filter layer disposed on the second substrate and comprising a first color filter, a second color filter, and a third color filter;
   a bank layer disposed on the color filter layer and comprising a first bank portion that defines a first opening corresponding to the light-emitting element and a second bank portion that defines a second opening around the first opening and is disposed not to be overlapped with the first bank portion, wherein a second height from an upper surface of the second substrate to an upper surface of at least part of the second bank portion is less than a first height from the upper surface of the second substrate to an upper surface of the first bank portion; and
   a color conversion layer disposed in the first opening.

2. The display apparatus of claim 1, wherein the first color filter, the second color filter, and the third color filter are disposed between the second substrate and the first bank portion.

3. The display apparatus of claim 1, wherein at least part of the second bank portion is disposed directly on the second substrate.

4. The display apparatus of claim 1, wherein at least one of the first color filter, the second color filter, and the third color filter is not disposed between the second substrate and the second bank portion.

5. The display apparatus of claim 4, wherein the third color filter is disposed between the second substrate and the second bank portion.

6. The display apparatus of claim 1, wherein an area of the second opening is less than an area of the first opening.

7. The display apparatus of claim 1, wherein at least one of the first color filter, the second color filter, and the third color filter is exposed through the first opening.

8. The display apparatus of claim 7, wherein the color conversion layer comprises a first color conversion layer, a second color conversion layer, and a transmissive layer, and wherein the first color conversion layer is disposed on the first color filter, the second color conversion layer is disposed on the second color filter, and the transmissive layer is disposed on the third color filter.

9. The display apparatus of claim 8, wherein the first color conversion layer comprises a first quantum dot and the second color conversion layer comprises a second quantum dot.

10. The display apparatus of claim 1, wherein the second opening comprises a plurality of second openings,
wherein the second bank portion comprises a branch portion in which second bank portions extending in different directions cross each other, and
wherein a height from the upper surface of the second substrate to an upper surface of the branch portion is less than a height from the upper surface of the second substrate to the upper surface of the first bank portion.

11. The display apparatus of claim 10, wherein a height from the upper surface of the second substrate to the upper surface of the branch portion is less than a height from the upper surface of the second substrate to an upper surface of the second bank portion except the branch portion.

12. The display apparatus of claim 10, wherein a step between the upper surface of the branch portion and the upper surface of the first bank portion is about 3.5 µm or more.

13. The display apparatus of claim 1, wherein at least one of the first color filter, the second color filter, and the third color filter is disposed in the second opening.

14. The display apparatus of claim 1, wherein the color filter layer has a step between the second substrate and the bank layer.

15. The display apparatus of claim 14, wherein at least one of the first color filter, the second color filter, and the third color filter has a portion having a reduced thickness and disposed between the second substrate and the second bank portion.

16. The display apparatus of claim 14, wherein a thickness of at least one of the first color filter, the second color filter and the third color filter disposed in a region corresponding to the second bank portion is less than a thickness of at least one of the first color filter, the second color filter, and the third color filter disposed in a region corresponding to the first bank portion.

17. The display apparatus of claim 14, wherein the second opening comprises a plurality of second openings,
wherein the second bank portion comprises a branch portion in which second bank portions extending in different directions cross each other, and
wherein a thickness of at least one of the first color filter, the second color filter, and the third color filter in a region corresponding to the branch portion is less than the thickness of the at least one of the first color filter, the second color filter, and the third color filter in a remaining second bank portion except the branch portion.

18. The display apparatus of claim 1, wherein the light-emitting element comprises an organic light-emitting diode configured to emit blue light.

19. The display apparatus of claim 1, wherein the display substrate further comprises a thin film encapsulation layer that is disposed to cover the light-emitting element, and
a distance from an upper surface of the thin film encapsulation layer to an upper surface of the second bank portion is greater than a distance from the upper surface of the thin film encapsulation layer to the upper surface of the first bank portion.

20. The display apparatus of claim 19, wherein the second opening comprises a plurality of second openings,
wherein the second bank portion comprises a branch portion in which second bank portions extending in different directions cross each other, and
a distance from the upper surface of the thin film encapsulation layer to an upper surface of the branch portion is greater than the distance from the upper surface of the thin film encapsulation layer to the upper surface of the first bank portion.

21. The display apparatus of claim 20, wherein the second opening comprises a plurality of second openings,
wherein the second bank portion comprises a branch portion in which second bank portions extending in different directions cross each other, and
wherein the distance from the upper surface of the thin film encapsulation layer to the upper surface of the branch portion is greater than a distance from the upper surface of the thin film encapsulation layer to the surface of the second bank portion except the branch portion.

22. A display apparatus comprising:
a first substrate and a second substrate disposed to face the first substrate;
a light-emitting element disposed on the first substrate;
a thin film encapsulation layer disposed to cover the light-emitting element, an upper surface of the thin film encapsulation layer having a flat surface;
a bank layer disposed above the thin film encapsulation layer and having a first opening corresponding to the light-emitting element and a second opening disposed around the first opening;
a color conversion layer disposed in the first opening; and
a color filter layer disposed between the second substrate and the color conversion layer, and between the second substrate and the bank layer,
wherein the bank layer comprises a first bank portion that defines the first opening and a second bank portion that defines the second, and
wherein a second distance from an upper surface of the thin film encapsulation layer to an upper surface of the second bank portion is greater than a first distance from the upper surface of the thin film encapsulation layer to an upper surface of the first bank portion.

23. The display apparatus of claim 22, wherein the color filter layer comprises a first portion disposed between the second substrate and the first bank portion and a second portion disposed between the second substrate and the second bank portion, and
wherein a thickness of the second portion is less than a thickness of the first portion.

24. The display apparatus of claim 22, wherein at least part of the color conversion layer comprises a quantum dot.

* * * * *